(12) United States Patent
Yoshitomi et al.

(10) Patent No.: US 10,439,032 B2
(45) Date of Patent: Oct. 8, 2019

(54) SEMICONDUCTOR DEVICE AND METHOD OF MANUFACTURING SAME

(71) Applicant: Renesas Electronics Corporation, Tokyo (JP)

(72) Inventors: Atsushi Yoshitomi, Tokyo (JP); Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/978,296

(22) Filed: May 14, 2018

(65) Prior Publication Data
US 2018/0374924 A1 Dec. 27, 2018

(30) Foreign Application Priority Data
Jun. 22, 2017 (JP) ................. 2017-122001

(51) Int. Cl.
| | |
|---|---|
| *H01L 29/423* | (2006.01) |
| *H01L 27/11568* | (2017.01) |
| *H01L 29/66* | (2006.01) |
| *H01L 29/78* | (2006.01) |
| *H01L 29/792* | (2006.01) |

(52) U.S. Cl.
CPC .... *H01L 29/4234* (2013.01); *H01L 27/11568* (2013.01); *H01L 29/42372* (2013.01); *H01L 29/66795* (2013.01); *H01L 29/66833* (2013.01); *H01L 29/785* (2013.01); *H01L 29/792* (2013.01)

(58) Field of Classification Search
CPC ............... H01L 29/4234; H01L 29/792; H01L 29/66795; H01L 29/785; H01L 29/66833; H01L 27/11568; H01L 29/42372
See application file for complete search history.

(56) References Cited

U.S. PATENT DOCUMENTS

| | | | | |
|---|---|---|---|---|
| 7,504,689 B2 * | 3/2009 | Hisamoto | ......... | H01L 21/28273 257/315 |
| 7,816,730 B2 * | 10/2010 | Lee | ...................... | H01L 29/7851 257/331 |
| 8,188,551 B2 * | 5/2012 | Schulz | ............ | H01L 21/823821 257/401 |
| 8,217,435 B2 * | 7/2012 | Chang | ................... | H01L 27/108 257/288 |
| 9,331,072 B2 * | 5/2016 | Seo | ....................... | H01L 27/088 |
| 9,741,869 B1 * | 8/2017 | Mihara | ............... | H01L 27/1157 |

(Continued)

FOREIGN PATENT DOCUMENTS

JP 2006-041354 A 2/2006

*Primary Examiner* — Earl N Taylor
(74) *Attorney, Agent, or Firm* — McDermott Will & Emery LLP

(57) ABSTRACT

To provide a semiconductor device having improved reliability by relaxing the unevenness of the injection distribution of electrons and holes into a charge accumulation film attributable to the shape of the fin of a MONOS memory comprised of a fin transistor. Of a memory gate electrode configuring a memory cell formed above a fin, a portion contiguous to an ONO film that covers the upper surface of the fin and a portion contiguous to the ONO film that covers the side surface of the fin are made of electrode materials different in work function, respectively, and the boundary surface between them is located below the upper surface of the fin.

18 Claims, 36 Drawing Sheets

(56) References Cited

U.S. PATENT DOCUMENTS

| | | | |
|---|---|---|---|
| 2006/0063319 A1* | 3/2006 | Ono | H01L 29/42384 |
| | | | 438/197 |
| 2008/0251839 A1* | 10/2008 | Lee | H01L 29/66795 |
| | | | 257/331 |
| 2018/0012901 A1* | 1/2018 | Tsuda | H01L 29/66833 |
| 2018/0061997 A1* | 3/2018 | Kawashima | H01L 21/28282 |
| 2018/0097007 A1* | 4/2018 | Tsukuda | H01L 21/28282 |
| 2018/0182768 A1* | 6/2018 | Mihara | H01L 27/11568 |
| 2018/0374924 A1* | 12/2018 | Yoshitomi | H01L 29/4234 |

* cited by examiner

SEMICONDUCTOR DEVICE AND METHOD OF MANUFACTURING SAME

CROSS-REFERENCE TO RELATED APPLICATIONS

The disclosure of Japanese Patent Application No. 2017-122001 filed on Jun. 22, 2017 including the specification, drawings and abstract is incorporated herein by reference in its entirety.

BACKGROUND

The present invention relates to the structure of a semiconductor device and a method of manufacturing the device, in particular, to a technique effective when applied to a semiconductor device including a fin transistor.

There is proposed an electric field effect transistor having a protruding semiconductor layer, that is, a layer protruding upward from the plane of a substrate and having a channel region on at least both planes (both side surfaces) substantially perpendicular to the plane of the substrate (which transistor will hereinafter be called "fin electric field effect transistor and abbreviated as "FinFET") in order to reduce a short channel effect which will be caused by miniaturization.

The FinFET is shaped to have a three dimensional structure on a two dimensional substrate. Supposing that the area of the substrate is equal, this transistor has current driving ability greater than that of a planar transistor. Since a gate has a structure of wrapping a channel therein, the gate has high channel controllability and a leakage current at the time when the device is OFF is reduced largely. It is therefore possible to actualize an electric field transistor having a high operation rate, driven at low power consumption, and facilitating provision in a miniaturized form.

As an electrically programmable and erasable nonvolatile semiconductor memory device, EEPROM (electrically erasable and programmable read only memory) has been used widely. This memory device typified by flash memory which is popular now stores data by providing a charge accumulation region in the gate insulating film of a MISFET and making use of a nonvolatile change of a threshold voltage attributable to the region. Readout is performed by determining the threshold voltage from the channel current value of the MISFET. Accumulation of charges is actualized using a floating gate electrode surrounded with an insulating film or a trap level in the insulating film.

As this flash memory, there is a split gate cell using a MONOS (metal oxide nitride oxide semiconductor) film. This split gate MONOS is characterized by that it can actualize high charge retention characteristics (reliability) because of trapping of charges in a SiN film and high-speed and low-power-consumption readout because of using a thin-film gate oxide film for a control gate.

The present inventors have been engaged in research and development of semiconductor devices having a nonvolatile memory cell as described above and they are now developing a split gate type Fin-MONOS device.

As the background technique in this technical field, there is, for example, a technique of Patent Document 1. Patent Document 1 discloses a split gate MONOS memory comprised of a FinFET.

Patent Document

[Patent Document 1] Japanese Unexamined Patent Application Publication No. 2006-41354

SUMMARY

In a memory cell comprised of a FinFET, due to the characteristic shape of a semiconductor layer protruding from a substrate (which will hereinafter be called "protruding semiconductor layer and it may also be called "fin"), electric field concentration occurs at a round portion (corner portion) of the upper portion of the fin. There is therefore a fear that a charge retention film (ONO film) is deteriorated by a voltage applied at the time of data rewriting and this may lead to deterioration in rewriting or worsening of data retention characteristics.

Another problem and novel features will be apparent from the description herein and accompanying drawings.

According to one embodiment disclosed herein, in a MONOS memory comprised of a FinFET, an upper portion and a lower portion of a memory gate electrode configuring a memory cell are made of electrode materials respectively different in work function and the boundary surface between them lies below the upper surface of the fin.

The above-described one embodiment can provide a semiconductor device having improved reliability.

DETAILED DESCRIPTION

Figure 1:
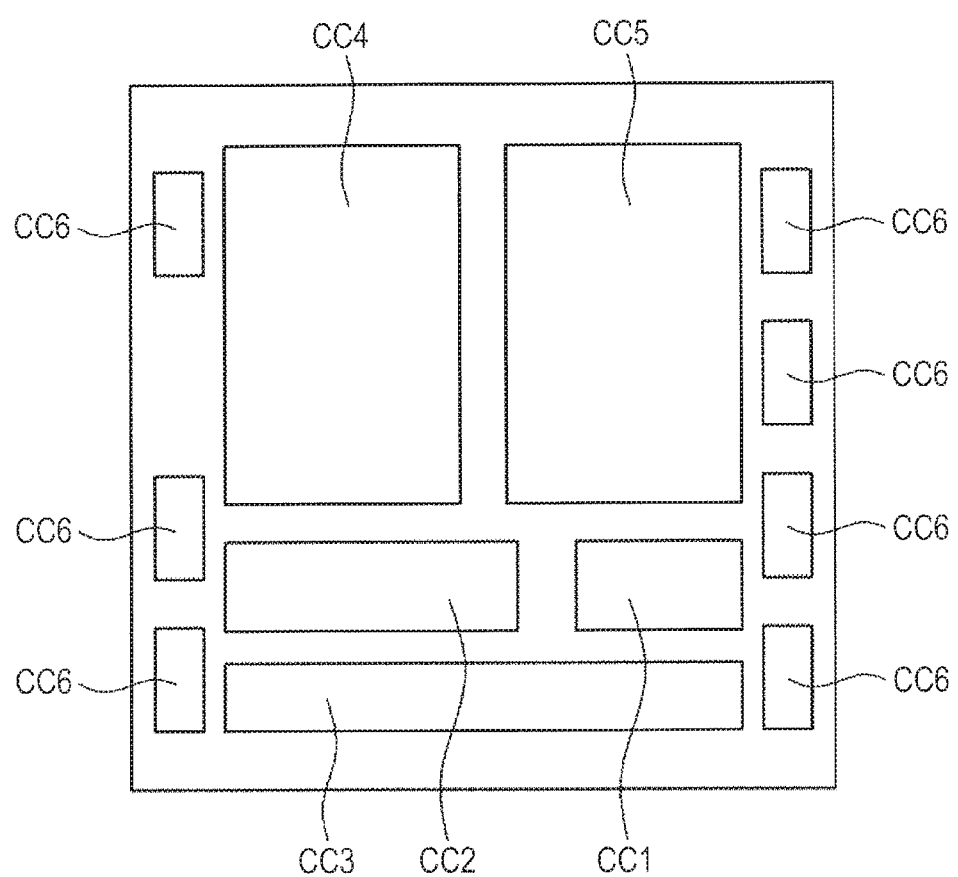
FIG. 1 is a schematic view showing the layout configuration of a semiconductor chip according to First Embodiment of the invention.

Examples will hereinafter be described referring to drawings. In each drawing, same configurations will be identified by the same reference numeral and detailed description of overlapping portions will be omitted.

Example 1

A semiconductor device of Example 1 having a nonvolatile memory will be described referring to FIGS. 1 to 8, FIG. 11, and FIG. 12. FIG. 1 is a schematic view showing the layout of a semiconductor chip CHP of the present example. As shown in FIG. 1, the semiconductor chip CHP has a CPU (central processing unit) CC1, a RAM (random access memory) CC2, and an analog circuit CC3. The semiconductor chip CHP further has an EEPROM (electrically erasable programmable read only memory) CC4, a flash memory CC5, and I/O (input/output) circuits CC6 arranged at the periphery of the semiconductor chip CHP. They configure this semiconductor device.

The CPU CC1 is also called a central processing unit. It reads out and decodes instructions from a memory device and based on them, performs a variety of operations and controls.

The RAM CC2 is a memory capable of reading out stored data at random, in other words, reading out stored data at any time, and capable of writing stored data newly. It is also called a random access memory. As the RAM, a SRAM (static RAM) using a static circuit is used.

The analog circuit CC3 is a circuit dealing with analog signals, that is, voltage and current signals which undergo a continuous time-dependent change. It is comprised of, for example, an amplifier circuit, a conversion circuit, a modulation circuit, an oscillator circuit, and a power supply circuit.

The EEPROM CC4 and the flash memory CC5 belong to a nonvolatile memory capable of electrically rewriting stored date in both write operation and erase operation. It is also called an electrically erasable programmable read only memory. The memory cell of these EEPROM CC4 and flash memory CC5 is comprised of a transistor for memory such as MONOS (metal oxide nitride oxide semiconductor) transistor or MNOS (metal nitride oxide semiconductor) transistor.

A difference between the EEPROM CC4 and the flash memory CC5 is that the EEPROM CC4 is, for example, a nonvolatile memory permitting erasure by byte, while the flash memory CC5 is, for example, a nonvolatile memory permitting erasure by word line. In general, the flash memory CC5 stores therein a program for performing a variety of processing in the CPU CC1. On the other hand, the EEPROM CC4 stores therein a variety of data having high rewrite frequency. The EEPROM CC4 or flash memory CC5 has a memory cell array in which a plurality of nonvolatile memory cells are arranged in matrix form and has, in addition, an address buffer, a row decoder, a column decoder, a verify sense amplifier circuit, a sense amplifier circuit, a write circuit, and the like.

The I/O circuit CC6 is an input/output circuit and is a circuit for outputting data from the semiconductor chip CHP to an apparatus coupled to the outside of the semiconductor chip CHP or inputting data from the apparatus coupled to the outside of the semiconductor chip CHP to the semiconductor chip.

The semiconductor device of the present embodiment has a memory cell region and a logic circuit region. The memory cell region has a memory cell array in which a plurality of nonvolatile memory cells is arranged in matrix form. The logic circuit region has an address buffer, a row decoder, a column decoder, a verify sense amplifier circuit, a sense amplifier circuit, or a write circuit of the CPU CC1, the RAM CC2, the analog circuit CC3, the I/O circuit CC6, and the EEPROM CC4 or the flash memory CC5.

Figure 2:
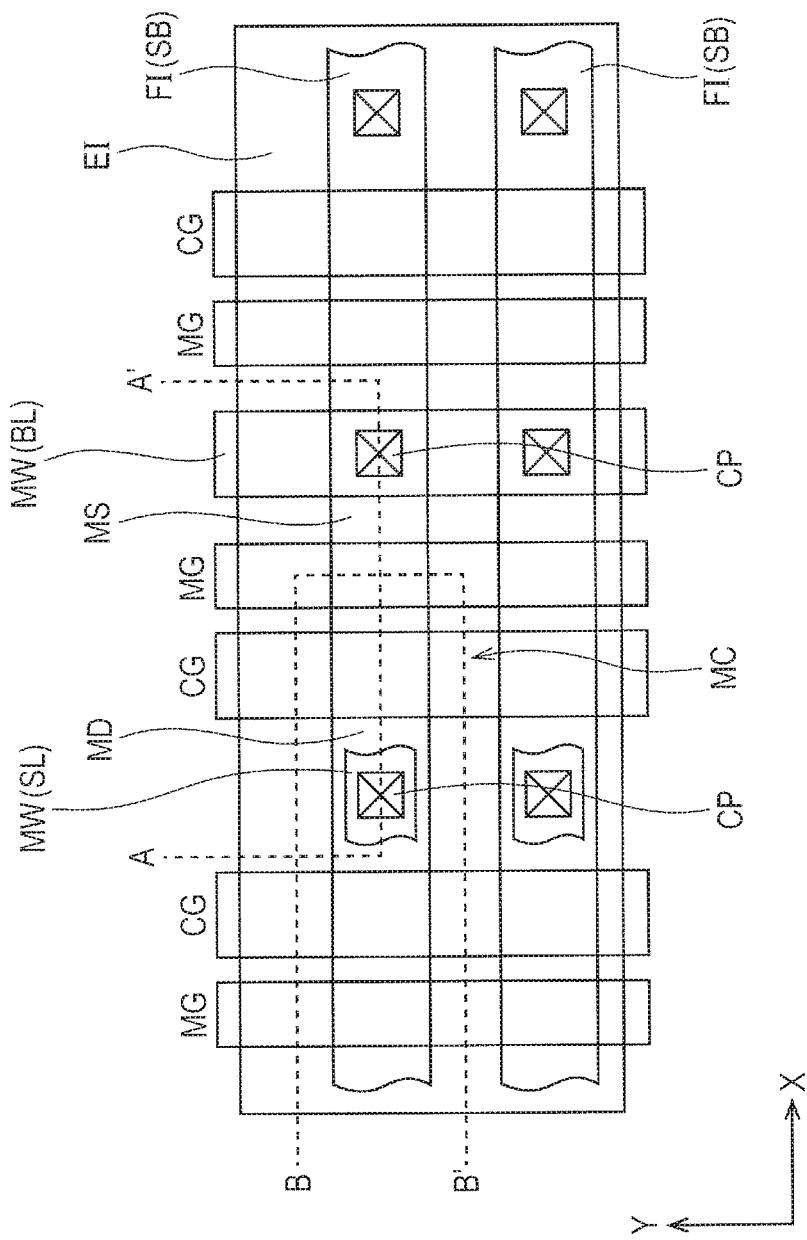
FIG. 2 is a plan view showing a portion of a semiconductor device according to First Embodiment of the invention.

FIG. 2 is a plan view showing a memory cell array of the semiconductor device of the present example. A plurality of memory cells MC formed in the memory cell array is formed, for example, in the flash memory CC5 in FIG. 1. A region having memory cells therein will hereinafter be called a "memory cell region". In the memory cell region, fins FI extending in a direction X are arranged at predetermined intervals in a direction Y. The directions X and Y are directions along the main surface of a semiconductor substrate SB and the direction X crosses (is orthogonal to) the direction Y.

Figure 12:
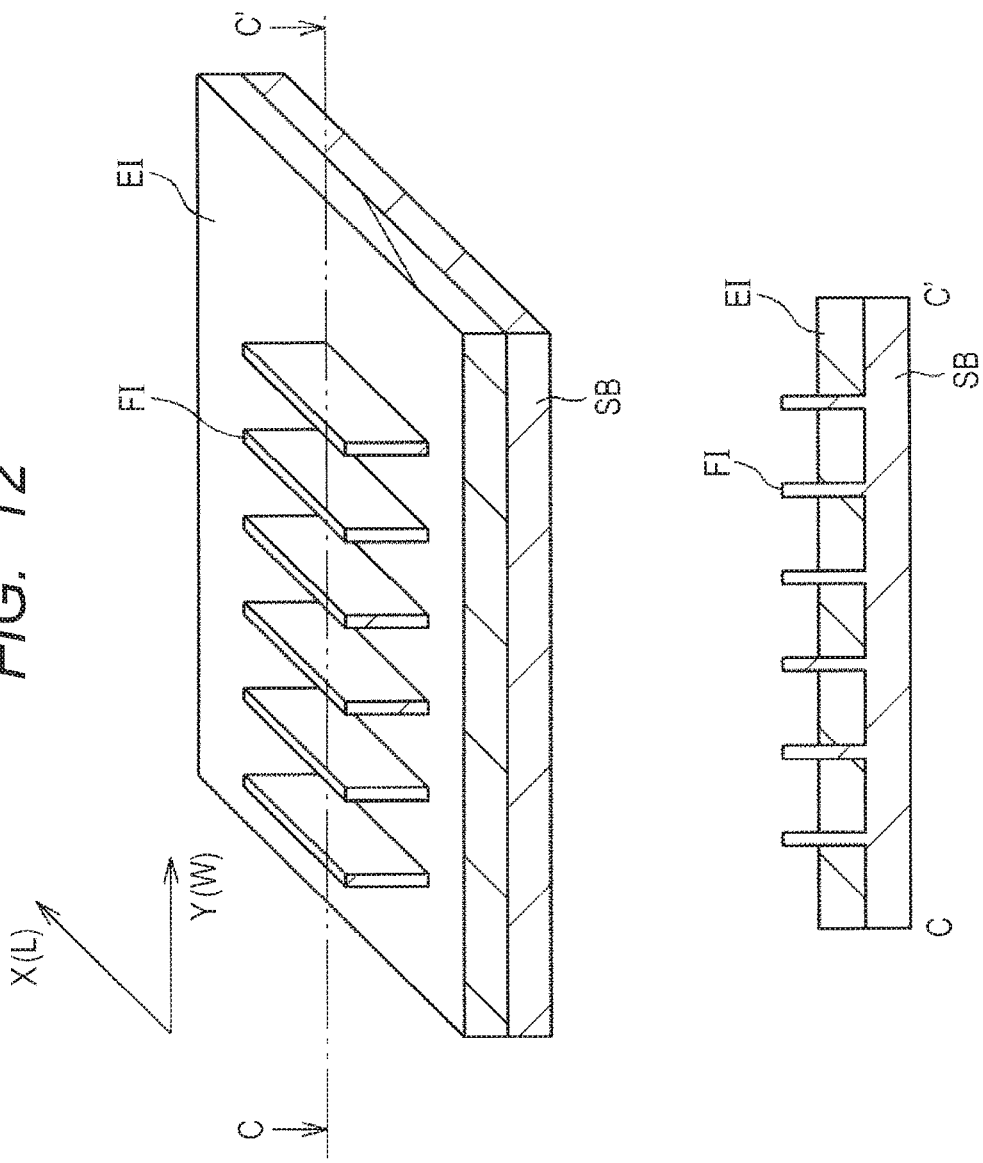
FIG. 12 shows the fin structure of the semiconductor device according to First Embodiment of the invention.

FIG. 12 shows the structure of the fin. The fin FI has a substantially cuboidal protruding shape which selectively protrudes from the main surface of the semiconductor substrate SB. The fin FI is a portion of the semiconductor substrate SB and is an active region (semiconductor layer) of the semiconductor substrate SB. In plan view of the semiconductor substrate SB, two fins FI adjacent to each other are filled therebetween with an element isolation film EI made of an insulating film and the fin FI is surrounded, at the periphery thereof, with the element isolation film EI. For this element isolation film EI, for example, STI (shallow trench isolation) is used. The fin FI is an active region (semiconductor layer) for forming the memory cell MC. The semiconductor substrate SB is made of p type single crystal silicon having a specific resistance of, for example, from about 1 to 10 Ωcm, or the like.

As shown in FIG. 12, the fin FI is, at the lower end portion thereof, surrounded with the element isolation film EI that covers the main surface of the semiconductor substrate SB. A portion of the fin FI however protrudes above the element isolation film EI. This means that all the regions between the fins adjacent to each other are not filled with the element isolation film EI.

The plurality of fins FI has thereover a plurality of control gate electrodes CG and a plurality of memory gate electrodes MG extending in the direction Y. The fins FI have, on the upper surface thereof, a drain region MD on the side of the control gate electrode CG and a source region MS on the side of the memory gate electrode so as to sandwich the control gate electrode CG and the memory gate electrode MG therebetween. This means that one of the control gate electrodes CG and one of the memory gate electrodes MG adjacent to each other in the direction X are present between the source region MS and the drain region MD.

The drain region MD and the source region MS are each an n type semiconductor region. The drain region MD lies between two control gate electrodes CG adjacent to each other in the direction X and the source region MS lies between two memory gate electrodes MG adjacent to each other in the direction X. The memory cell MC is a nonvolatile memory element comprised of the control gate electrode CG, the memory gate electrode MG, the drain region MD, and the source region MS. A source region MS and a drain region MD configuring one of the memory cells MC may hereinafter be called a "source-drain region".

Two memory cells adjacent to each other in the direction X have a drain region MD or a source region MS in common. Two memory cells MC having the drain region MD in common are axisymmetrical in the direction X with the drain region MD extending in the direction Y as an axis, while two memory cells MC having the source region MS in common are axisymmetrical in the direction X with the source region MS extending in the direction Y as an axis.

The fins FI each have thereon a plurality of memory cells MC arranged in the direction X. The drain region MD of each of the memory cells MC is electrically coupled to, via a contact plug (via) CP formed in a contact hole penetrating an interlayer insulating film (not illustrated) formed on the memory cell MC, a source line SL made of a wiring MW extending in the direction X. The source region MS of each of the plurality of memory cells MC arranged in the direction Y is electrically coupled to a bit line BL made of a wiring MW extending in the direction Y.

Figure 5:
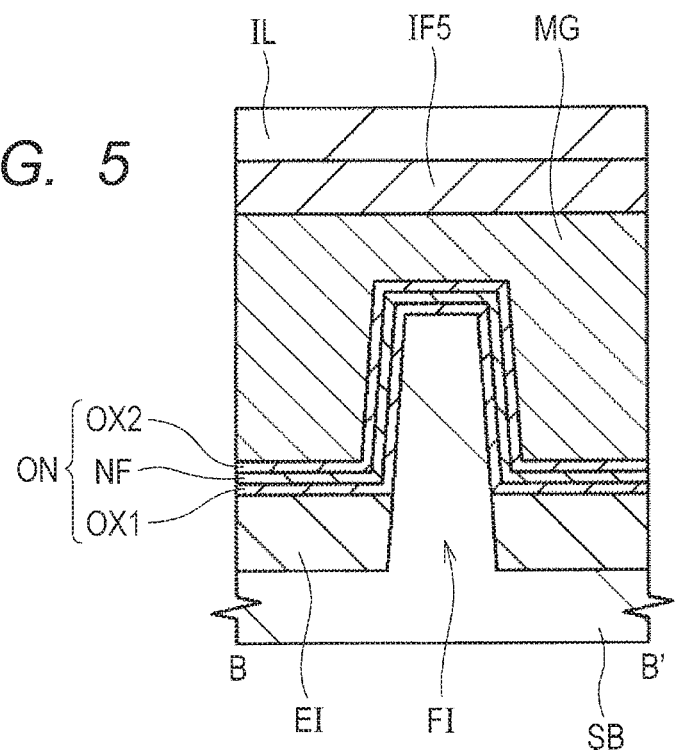
FIG. 5 is a cross-sectional view taken along the line B-B' of FIG. 2.

The fin FI is a substantially cuboidal protruding semiconductor layer which protrudes from the main surface of the semiconductor substrate SB in a direction perpendicular to the main surface. The fin FI is not always required to be a cuboid and in a cross-sectional view in a short-side direction, its rectangular shape may have a round corner portion. In addition, the side surfaces of the fin FI may each be perpendicular to the main surface of the semiconductor substrate SB, but they may have an angle near right angle as shown in FIG. 5. This means that each of the fins Fi may have either a substantially rectangular or trapezoidal cross-section. In this drawing, each of the side surfaces of the fin FI is inclined relative to the main surface of the semiconductor substrate SB.

As shown in FIG. 2, in plan view of the semiconductor substrate SB, the extending direction of each of the fins FI is a long-side direction thereof and a direction orthogonal to this long-side direction is a short-side direction of the fin. This means that the length of the fin is longer than the width of the fin. The fin FI can have any shape insofar as it is a protruding semiconductor layer having a length, a width, and a height. It may have, for example, a meandering layout in plan view.

Figure 3:
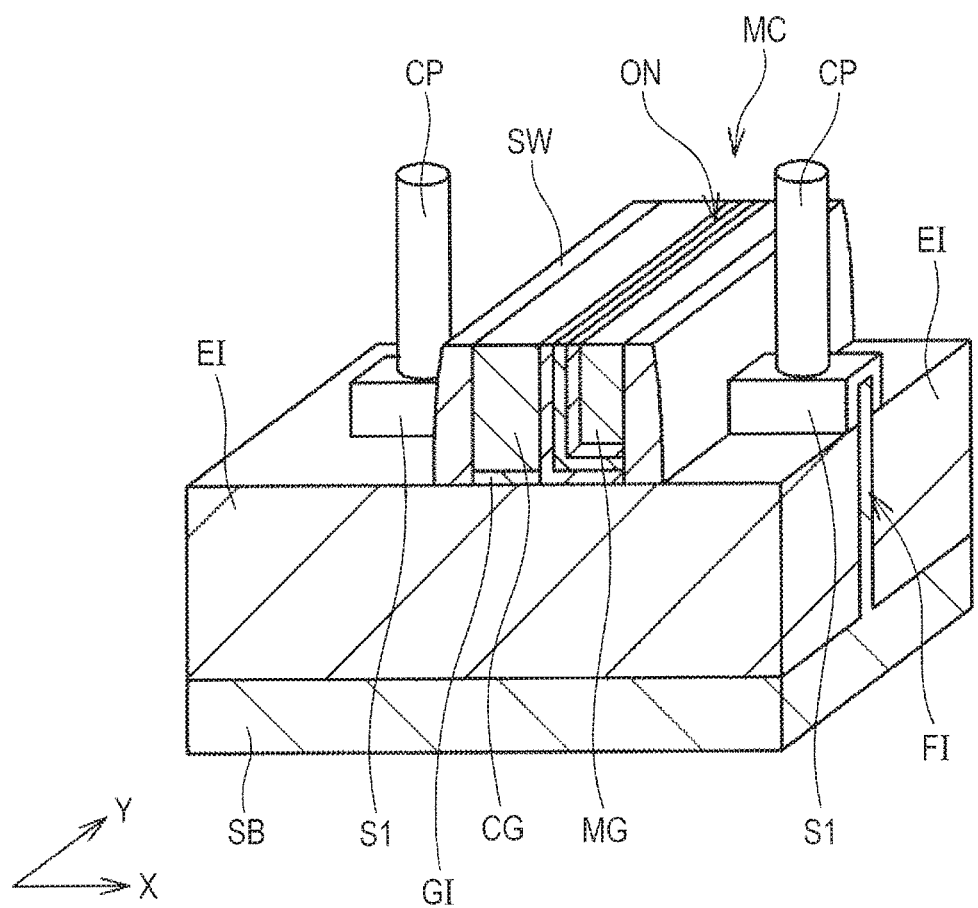
FIG. 3 is a perspective view showing a portion of the semiconductor device according to First Embodiment of the invention.

FIG. 3 is a perspective view of the semiconductor device of the present example. To facilitate understanding of the structure of the memory cell region, FIG. 3 includes none of an interlayer insulating film and a wiring on the element isolation film EI and each element, a cap insulating film on the control gate electrode CG, and a cap insulating film on the memory gate electrode MG. The fin FI in the memory cell region has thereon the memory cell MC. As shown in FIG. 3, the control gate electrode CG and the memory gate electrode MG extend in the direction Y so as to cross the fin FI and stride over the fin FI.

Figure 4:
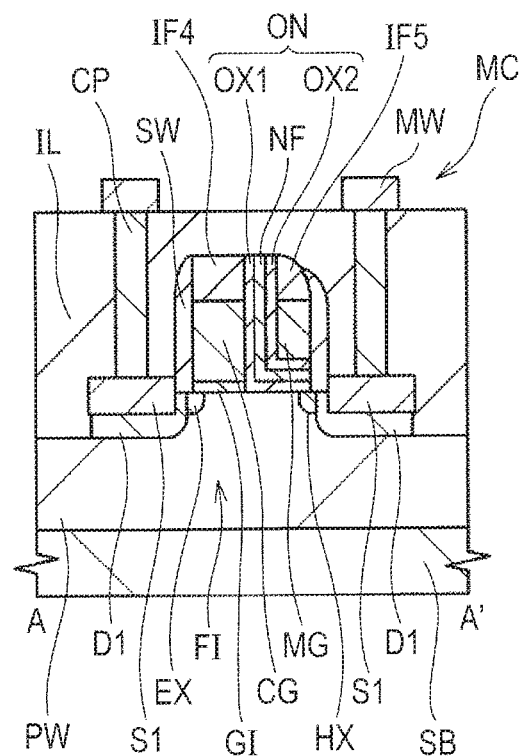
FIG. 4 is a cross-sectional view taken along the line A-A' of FIG. 2.

FIG. 4 is a cross-sectional view taken along the line A-A' of FIG. 2. FIG. 5 is a cross-sectional view taken along the line B-B' of FIG. 2. A plurality of elements are arranged on one of the fins FI, but FIGS. 3 and 4 show only one memory cell MC on the fin FI.

As shown in FIG. 4, the control gate electrode CG has an upper surface covered with an insulating film IF4 and the memory gate electrode MG has an upper surface covered with an insulating film IF5. The insulating films IF4 and IF5 are each made of, for example, a silicon nitride film. The control gate electrode CG is made of, for example, a polysilicon film and the polysilicon film has an n type impurity (for example, P (phosphorus) or As (arsenic)) introduced therein. The memory gate electrode MG is made of, for example, a polysilicon film. The main characteristic of the present embodiment resides in the structure and electrode material of the memory gate electrode MG and this characteristic will be described later.

As shown in FIGS. 3 and 4, the fin FI having therein a diffusion region D1 configuring the source-drain region of the memory cell region has an upper surface and side surface covered with a silicide layer S1. The silicide layer S1 is made of, for example, NiSi (nickel silicide). The silicide layer S1 is comprised of a layer extending along the upper surface and the side surface of the fin FI.

As shown in FIGS. 3 to 5, the fin FI is surrounded, at the lower portion of each of the side surfaces thereof, with the element isolation film EI formed on the main surface of the semiconductor substrate SB. This means that the fins are separated from each other by the element isolation film EI. As shown in FIG. 4, the fin FI has therein a p well PW which is a p type semiconductor region extending from the upper surface to the lower portion of the fin FI.

The fin FI has, on the upper surface and side surface thereof, the control gate electrode CG via a gate insulating film GI. The control gate electrode CG has, in a region adjacent thereto in the long-side direction (direction X) of the fin FI, the memory gate electrode MG via an ONO film ON. The control gate electrode CG and the memory gate electrode MG have therebetween the ONO film ON and thus, the control gate electrode CG and the memory gate electrode MG are electrically separated from each other by the ONO film ON. In addition, the memory gate electrode MG and the upper surface of the fin FI have therebetween the ONO film ON. The ONO film ON is a continuous film that covers the side surface and the bottom surface of the memory gate electrode MG. The ONO film ON therefore has an L-shaped cross-section in the cross-sectional view along a gate length direction as shown in FIG. 4.

The gate insulating film GI is a thermal oxide film (silicon oxide film) formed by thermal oxidation of the main surface and side surface of the fin FI which is a protruding semiconductor layer of the semiconductor substrate SB made of silicon. It has a film thickness of, for example, 2 nm. The ONO film ON is comprised of a silicon oxide film OX1 made of a thermal oxide film (silicon oxide film) formed by thermal oxidation of the main surface and side surface of the fin FI which is a protruding semiconductor layer of the semiconductor substrate SB made of silicon, a silicon nitride film NF formed on the silicon oxide film OX1, a silicon nitride film NF formed on the silicon oxide film OX1, and a silicon oxide film OX2 formed on the silicon nitride film NF. The silicon nitride film NF is a charge accumulation portion (charge accumulation layer) of the memory cell MC. The silicon oxide film OX1 has a thickness of, for example, 4 nm, the silicon nitride film NF has a thickness of, for example, 7 nm and the silicon oxide film OX2 has a thickness of, for example, 9 nm.

This means that the ONO film ON has a film stacked structure comprised of the silicon oxide film OX1, the silicon nitride film NF, and the silicon oxide film OX2 stacked successively from the upper surface side of the fin FI and also from the side surface side of the control gate electrode CG. The thickness of the ONO film ON is, for example, 20 nm and is greater than that of the gate insulating film GI below the control gate electrode CG. The silicon oxide film OX2 may be made of a silicon oxynitride film.

In the short-side direction (direction Y) of the fin FI, the control gate electrode CG extends along the upper surface and side surface of the fin FI and the upper surface of the element isolation film EI via the gate insulating film GI. Similarly, in the short-side direction of the fin FI, the memory gate electrode MG extends along the main surface and side surface of the fin FI and the upper surface of the element isolation film EI via the ONO film ON.

A pattern including the control gate electrode CG, the memory gate electrode MG, the gate insulating film GI, the ONO film ON, and the insulating films IF4 and IF5 has a side surface covered with a sidewall (sidewall spacer) SW. The sidewall SW is made of a stacked structure of, for example, a silicon nitride film and a silicon oxide film. The silicide layer S1 covers therewith the surface of the fin FI exposed from the above-described pattern including the control gate electrode CG and the above-described sidewall SW.

As shown in FIG. 4, the fin FI has, in the surface thereof, a pair of source and drain regions so as to sandwich the upper surface of the fin FI immediately below the above-described pattern including the control gate electrode CG. The source region and the drain region each have an extension region EX which is an n$^-$ type semiconductor region and a diffusion region D1 which is an n$^+$ type semiconductor region. The diffusion region D1 has an impurity concentration and a formation depth greater than those of the extension region EX. In each of the source region and the drain region, the extension region EX and the diffusion region D1 are contiguous to each other. The extension region EX is located on the side closer to the upper surface of the fin FI immediately below the above-described pattern, in other words, on the side closer to a channel region than the diffusion region D1 is.

The drain region MD is adjacent to the fin FI immediately below the control gate electrode CG and the source region MS is adjacent to the fin FI immediately below the memory gate electrode MG. This means that the source and drain regions, in plan view, sandwich therebetween the pattern including the control gate electrode CG and the memory gate electrode MG and the drain region MD is located on the side of the control gate electrode CG and the source region MS is located on the side of the memory gate electrode MG. In other words, in plan view, the drain region MD is adjacent to the control gate electrode CG and the source region is adjacent to the memory gate electrode MG.

Thus, by forming a source-drain region having a structure equipped with the lightly doped extension region EX and the heavily doped diffusion region D1, in other words, having an LDD (lightly doped drain) structure, a transistor having the source-drain region can have improved short-channel characteristics. The source region corresponds to the source region MS shown in FIG. 2 and the drain region corresponds to the drain region MD shown in FIG. 2.

As shown in FIG. 4, the fin FI and the element isolation film EI have thereon an interlayer insulating film IL made of, for example, a silicon oxide film. The interlayer insulating film IL covers each of the fin FI, the element isolation film EI, the control gate electrode CG, the memory gate electrode MG, the source-drain region MS-MD, the insulating films IF4 and IF5, the sidewall SW, and the silicide layer S1. The interlayer insulating film IL has a planarized upper surface.

The interlayer insulating film IL has thereon a plurality of wirings MW and the wirings MW are electrically coupled to the source region and the drain region of the memory cell MC via a contact plug CP provided in a contact hole penetrating the interlayer insulating film IL. This means that the contact plug CP has a bottom surface directly contiguous to the upper surface of the silicide layer S1 and the contact plug CP is electrically coupled to the source-drain region via the silicide layer S1. The silicide layer S1 has a role of reducing the coupling resistance between the contact plug CP which is a coupling portion made of a metal film composed mainly of, for example, tungsten (W) and the source-drain region in the fin FI made of a semiconductor.

In the power feed region (not illustrated) of the control gate electrode CG, the insulating film IF4 on the control gate electrode CG is removed and the contact plug CP is coupled to the upper surface of the control gate electrode CG via the silicide layer. In the power feed region (not illustrated) of the memory gate electrode MG, the insulating film IF5 on the memory gate electrode MG is removed and the contact plug CP is coupled to the upper surface of the memory gate electrode MG via the silicide layer.

The memory cell MC is a nonvolatile memory element having the control gate electrode CG, the memory gate electrode MG, the drain region, and the source region. The control gate electrode CG and the source-drain region configure a control transistor and the memory gate electrode MG and the source-drain region configure a memory transistor. The memory cell MC is comprised of the control transistor and the memory transistor. This means that the control transistor and the memory transistor have one source-drain region in common. A distance between the drain region and the source region in the gate length direction (direction X) of the control gate electrode CG and the memory gate electrode MG corresponds to the channel length of the memory cell MC. The control transistor and the memory transistor are each a FinFET having the surface of the fin FI as a channel.

Here, as shown in FIG. 5, the memory gate electrode MG of the present embodiment covers, in the gate width direction (direction Y in FIG. 2), the side surface (sidewall) and the upper surface of the fin FI via the ONO (oxide nitride oxide) film ON. This means that the memory gate electrode MG lies on the upper surface and the side surface of the fin FI via the ONO film ON. In other words, the fin FI is adjacent to, at the side surface thereof, the memory gate electrode MG in the direction Y running along the main surface of the semiconductor substrate SB and the fin FI is adjacent to, at the upper surface thereof, the memory gate electrode MG in a direction perpendicular to the main surface of the semiconductor substrate SB.

Figure 6:
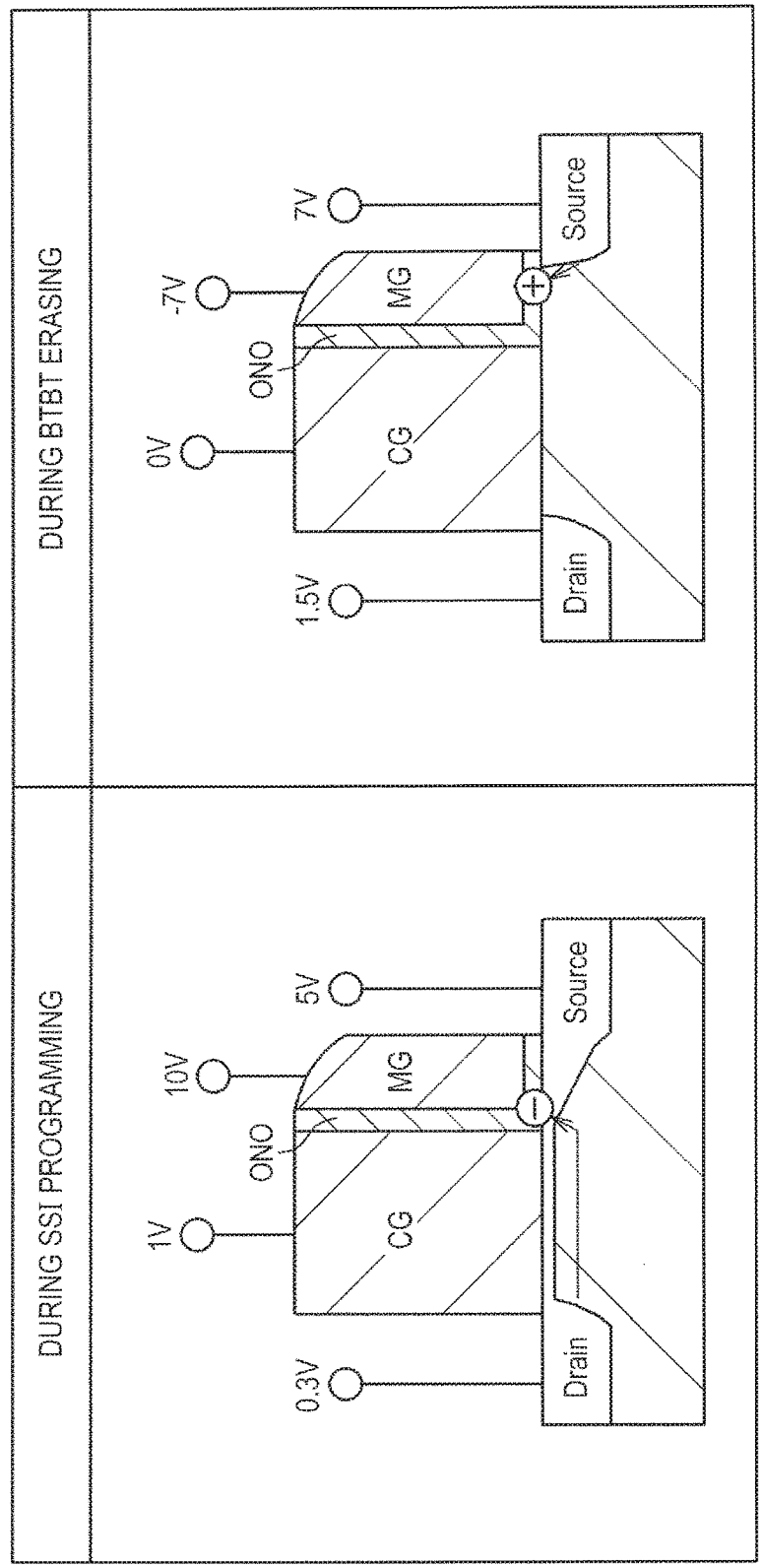
FIG. 6 schematically shows write/erase operation of a split gate MONOS memory.

Here, problems of the above-described split gate Fin-MONOS device will be described in detail referring to FIGS. 6 and 7. FIG. 6 schematically shows the write/erase operation of a split gate MONOS memory. To facilitate understanding of the description, FIG. 6 shows an example of a conventional planar MONOS memory.

In the conventional split gate MONOS memory, at the time of writing data, for example, voltages of 0.3V and 5V are applied to a drain electrode (Drain) and a source electrode (Source), respectively, and voltages of 1V and 10V are applied to a control gate electrode (CG) and a memory gate electrode (MG), respectively. A channel is therefore formed between the source electrode (Source) and the drain electrode (Drain). At this time, by an electric field generated by a difference in potential between the control gate electrode (CG) and the memory gate electrode (MG), energy is applied to the electrons of a channel to accelerate them and the electrons are injected from the side of the source electrode (Source) into the silicon nitride film of the ONO film serving as a charge accumulation film. This is a data writing method so called SSI (source-side-injection) writing.

At the time of erasing data, for example, voltages of 1.5V and 7V are applied to the drain electrode (Drain) and the source electrode (Source), respectively and voltages of 0V and −7V are applied to the control gate electrode (CG) and the memory gate electrode (MG), respectively. Holes are thereby injected into the silicon nitride film of the ONO film. This is a data erasing system so called "BTBT (band-to-band-tunneling) erasing.

Figure 7:
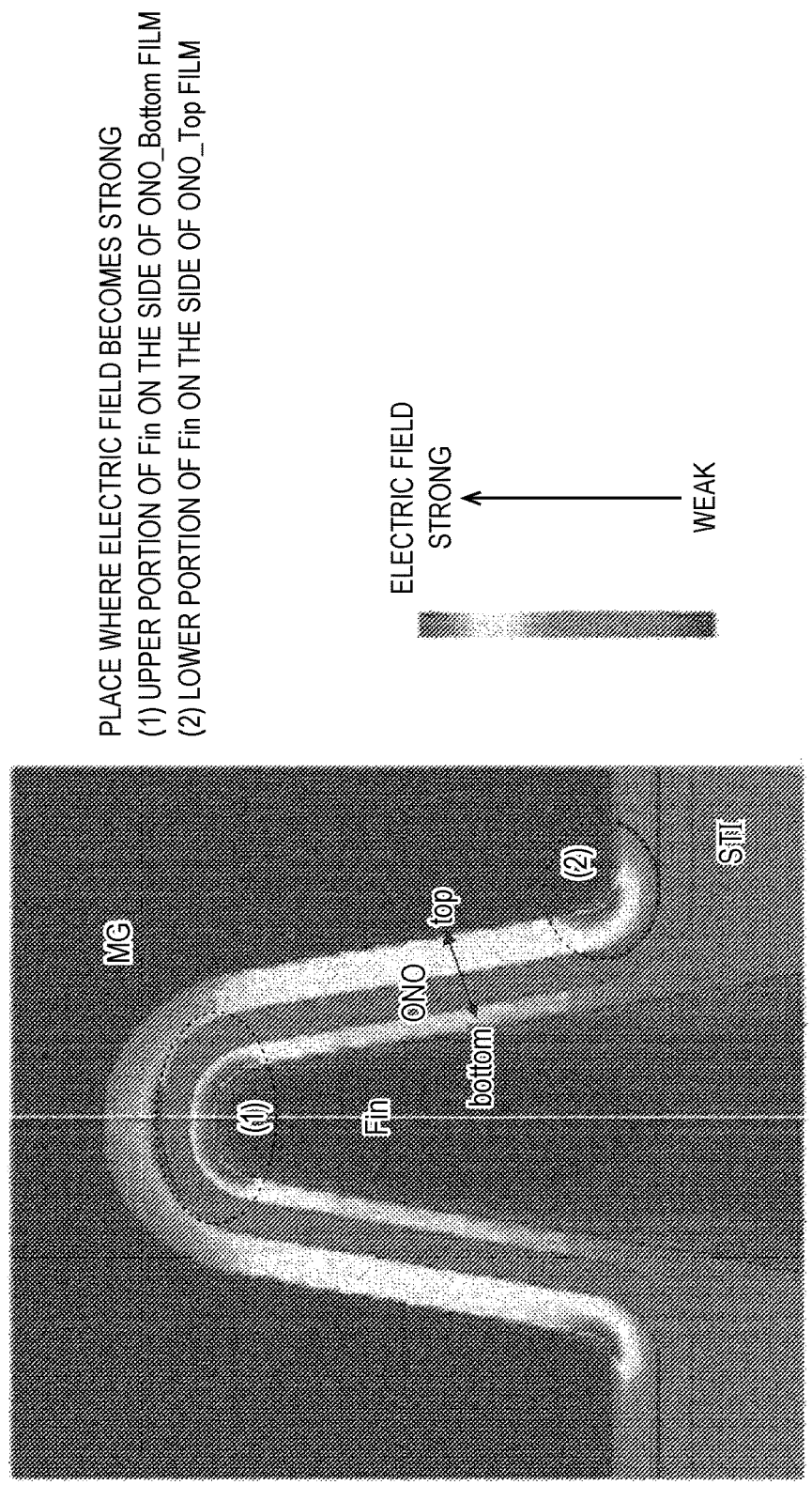
FIG. 7 shows simulation results of the electric field of a fin MONOS memory

FIG. 7 shows the electric field simulation results (at the time of MG bias application) when the above-described SSI writing/BTBT erasing is applied to a fin type MONOS structure. It is apparent from FIG. 7 that the places where the electric field becomes strong are the silicon oxide film (indicated by 1 in this drawing) on the side of the lower layer (bottom side) of the ONO film at the upper portion of the fin (Fin) and the silicon oxide film (indicated by 2 in this drawing) on the side of the upper layer (top side) of the ONO film at the lower portion of the fin (Fin). They correspond to the corner portion (round portion) of the fin (Fin) and the corner portion of the memory gate electrode MG (ONO film), respectively and are characteristic in shape.

In particular, the electric field concentration at the corner portion (round portion) of the upper portion of the fin (Fin) may lead to deterioration in rewriting or worsening of data retention characteristics (deterioration in retention characteristics) because it may deteriorate the ONO film, which is a charge retention film, by the voltage at the time of data rewriting.

Figure 8:
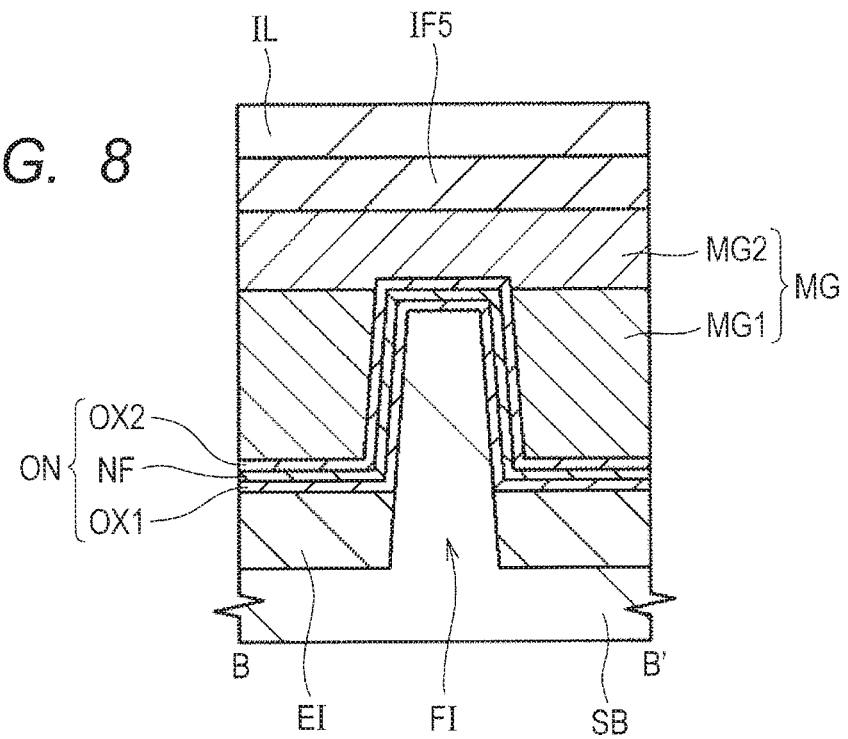
FIG. 8 is a cross-sectional view showing a portion of a semiconductor device according to First Embodiment (Example 1) of the present invention.

In the semiconductor device of the present example having a nonvolatile memory, as shown in FIG. 8, the memory gate electrode MG has a two-layer structure comprised of, as a lower layer, a memory gate electrode MG1 adjacent to the side surface of the fin FI via the ONO film ON and, as an upper layer, a memory gate electrode MG2 adjacent to the upper surface of the fin FI via the ONO film ON. In addition, the boundary surface between the memory gate electrode MG1 and the memory gate electrode MG2 is positioned below the upper surface of the fin FI (on the side of the main surface of the semiconductor substrate SB). More specifically, it is positioned below the linear portion of the upper surface of the fin FI and the corner region (corner portion) thereof.

The memory gate electrode MG1 and the memory gate electrode MG2 are made of electrode materials different from each other. For relaxing the electric field concentration at the upper portion of the fin (Fin), the electrode material used for the memory gate electrode MG2 has a threshold voltage (Vth) higher than that of the electrode material used for the memory gate electrode MG1. In other words, the electrode material of the memory gate electrode MG2 has a work function higher than that of the memory gate electrode MG1.

Figure 11:
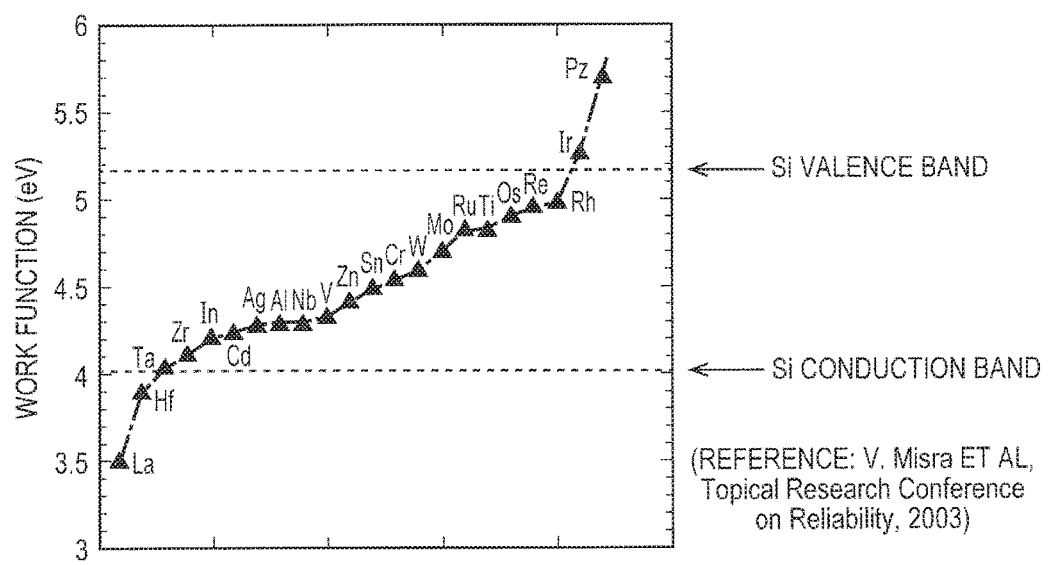
FIG. 11 shows the work function of metal gate electrode materials.

FIG. 11 shows the respective work functions of main metal gate electrode materials. Electrode materials used in combination for the memory gate electrode MG1 and the memory gate electrode MG2 are selected from conventional polysilicon and those shown in this graph. In the memory gate electrode MG of the present example shown in FIG. 8, the memory gate electrode MG1 on the lower portion side of the fin FI is made of n type polysilicon and the memory gate electrode MG2 on the upper portion side of the fin FI is made of a metal gate electrode material.

These metal gate electrode materials are more preferably selected from aluminum (Al), titanium (Ti), tantalum (Ta), ruthenium (Ru), and tungsten (W), and alloy materials thereof in view of affinity for another semiconductor manufacturing process such as wiring step.

It is also possible to provide a barrier metal made of, for example, titanium nitride (TiN) at the boundary surface between the memory gate electrode MG1 and the memory gate electrode MG2, that is, between the ONO film ON at the upper portion of the fin FI and the memory gate electrode MG2 and use it as a base protective film or a diffusion preventive film of the metal gate electrode material of the memory gate electrode MG2. In this case, the work function (that is, threshold voltage) of the memory gate electrode MG2 can be adjusted by changing the film thickness of the barrier metal film and the film thickness of the metal gate electrode material (memory gate electrode MG2).

Next, a method of manufacturing the semiconductor device of the present example will be described referring to FIGS. 13 to 28. A cross-section of the fin FI in the long direction (direction L) in FIG. 12 is shown on the left side of each of these drawings and a cross-section of the fin FI in the short direction (direction W) is shown on the right side.

Figure 13:
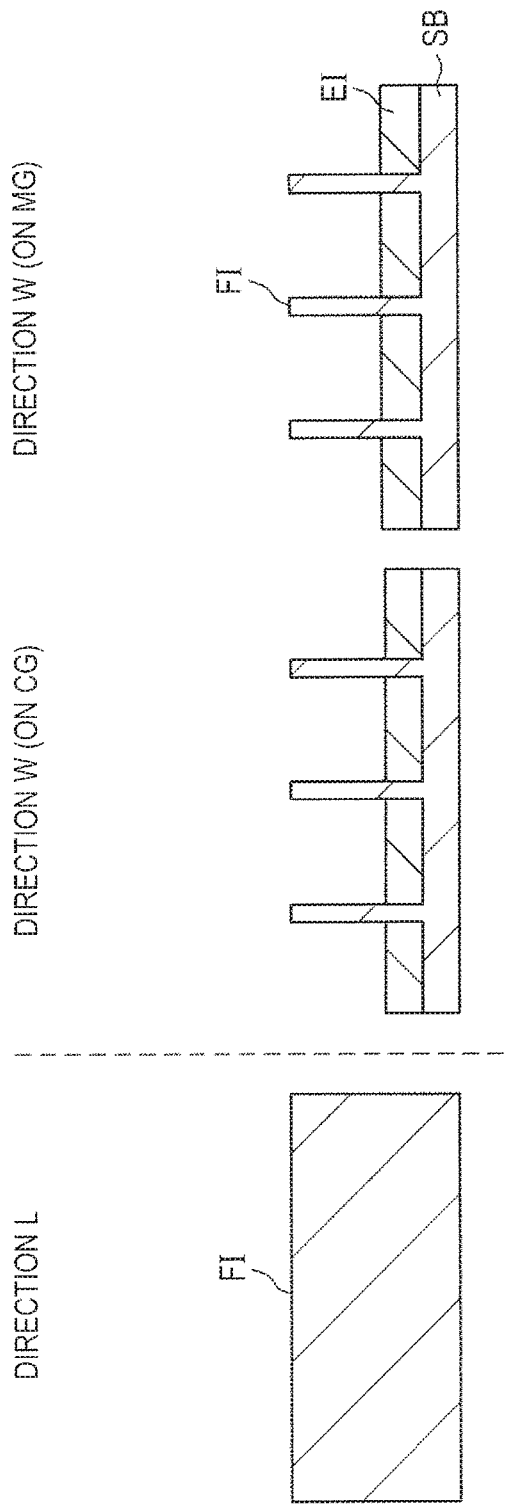
FIG. 13 is a cross-sectional view showing a process of manufacturing the semiconductor device according to First Embodiment (Example 1) of the invention.

First, as shown in FIG. 13, fins FI are formed on the main surface of the semiconductor substrate SB by photolithography and two of the fins FI adjacent to each other are filled therebetween with an element isolation EI. In the photolithography for forming the fin FI, a mask pattern is formed on the main surface of the semiconductor substrate SB with a resist film or an insulating film material (hard mask) and then, the mask pattern is dry etched to process the semiconductor substrate SB into a pattern of a desired size. Then, a space between the fins FI is filled with an STI oxide film (shallow trench isolation) which will be the element isolation EI, followed by CMP (chemical mechanical polishing) or wet etching to adjust the height of the STI oxide film. Thus, the fin structure is formed.

It is to be noted that spacer lithography using a dummy pattern is performed when the width of the fin FI (or width between the fins FI) is smaller than the minimum resolution size of an exposure apparatus. In spacer lithography, first, a dummy pattern is formed and then, a sidewall pattern is added using another material. By removing the first dummy pattern, the sidewall pattern remains at the outer periphery of the dummy pattern. The line width of the sidewall pattern is determined, not depending on lithography but depending on the film thickness of the sidewall pattern deposited. This leads to formation of a pattern having a uniform line width. By etching the semiconductor substrate SB with this pattern as a mask, a fin FI having a line width more uniform and thinner than the minimum resolution size of an exposure apparatus can be formed.

Figure 14:
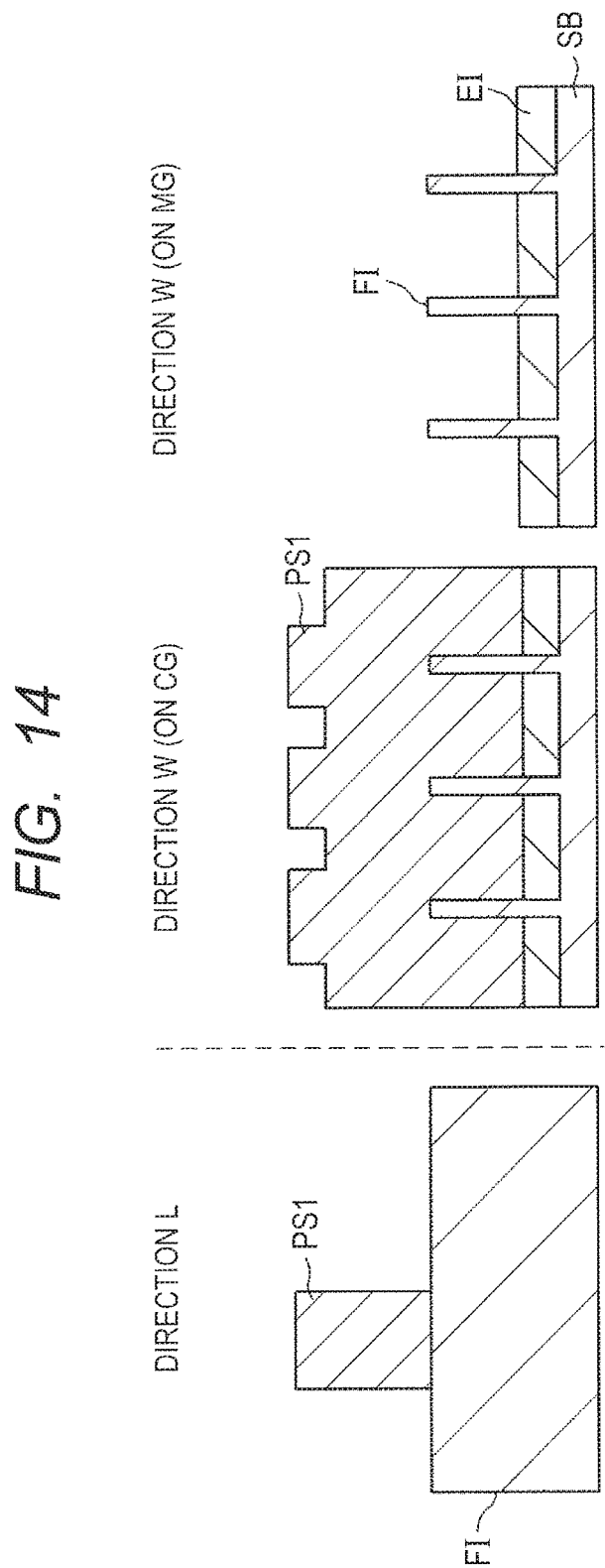
FIG. 14 is a cross-sectional view showing a process of manufacturing the semiconductor device following that of FIG. 13.

Next, as shown in FIG. 14, a polysilicon film PS1 is formed on the main surface of the semiconductor substrate SB and then a control gate electrode CG is formed by photolithography (resist patterning and dry etching).

Figure 15:
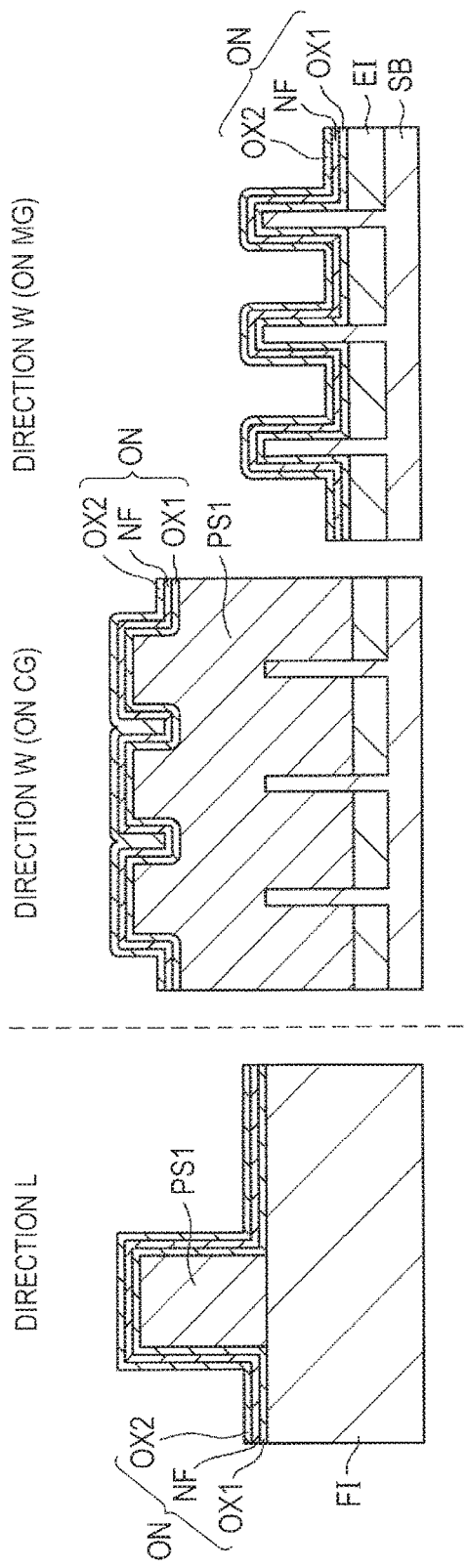
FIG. 15 is a cross-sectional view showing a process of manufacturing the semiconductor device following that of FIG. 14.

Next, as shown in FIG. 15, a silicon oxide film OX1, a silicon nitride film NF, and a silicon oxide film OX2 are stacked in order of mention from the lower layer side on the main surface of the semiconductor substrate SB to form a stacked film (ONO film ON) and thereby cover the upper surface and side surface of the fin FI therewith. The resulting ONO film ON is used as a charge retention film (charge accumulation film) of MONOS.

Figure 16:
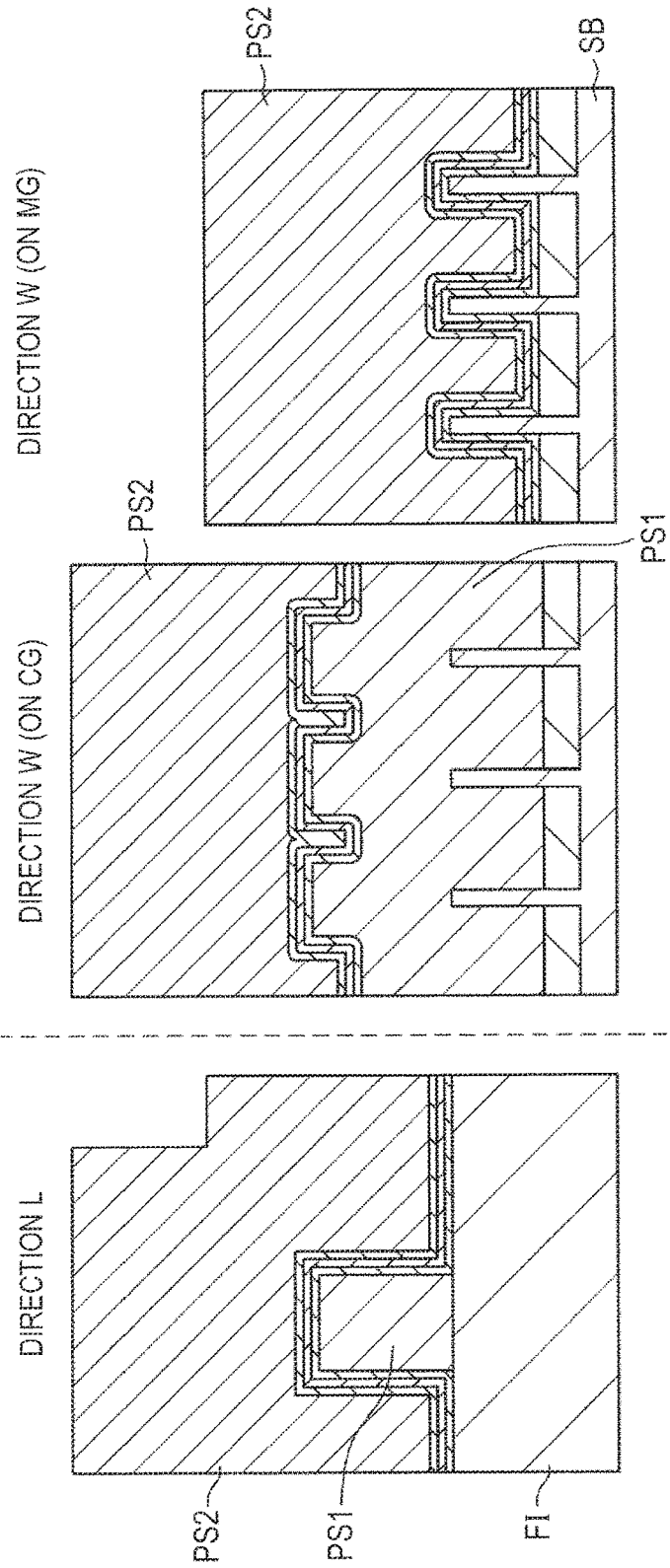
FIG. 16 is a cross-sectional view showing a process of manufacturing the semiconductor device following that of FIG. 15.

Next, as shown in FIG. 16, a polysilicon film PS2 which will be the memory gate electrode MG1 is formed on the main surface of the semiconductor substrate SB.

Figure 17:
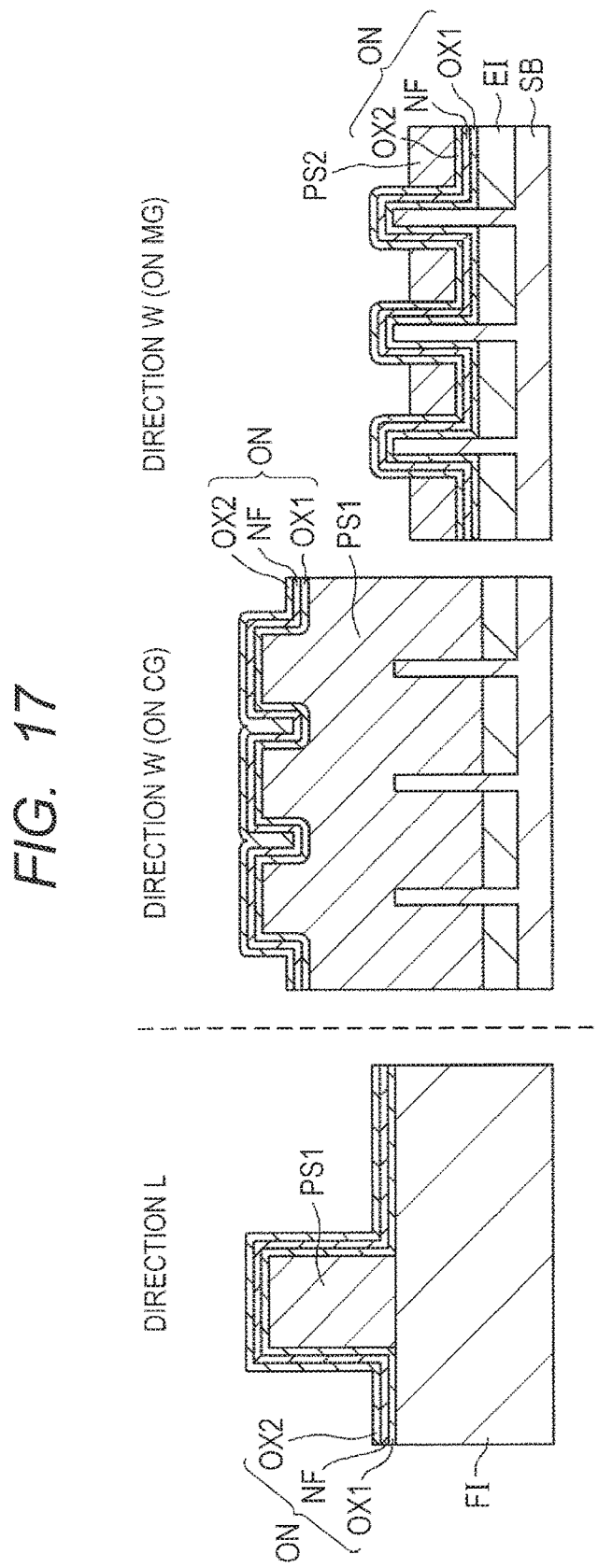
FIG. 17 is a cross-sectional view showing a process of manufacturing the semiconductor device following that of FIG. 16.

Next, as shown in FIG. 17, the polysilicon film PS2 is removed by dry etching. At this time, etching conditions are controlled so that the upper portion of the polysilicon film PS2 thus etched is located below (the main surface side of the semiconductor substrate SB) the upper portion (top portion) of the fin FI.

Figure 18:
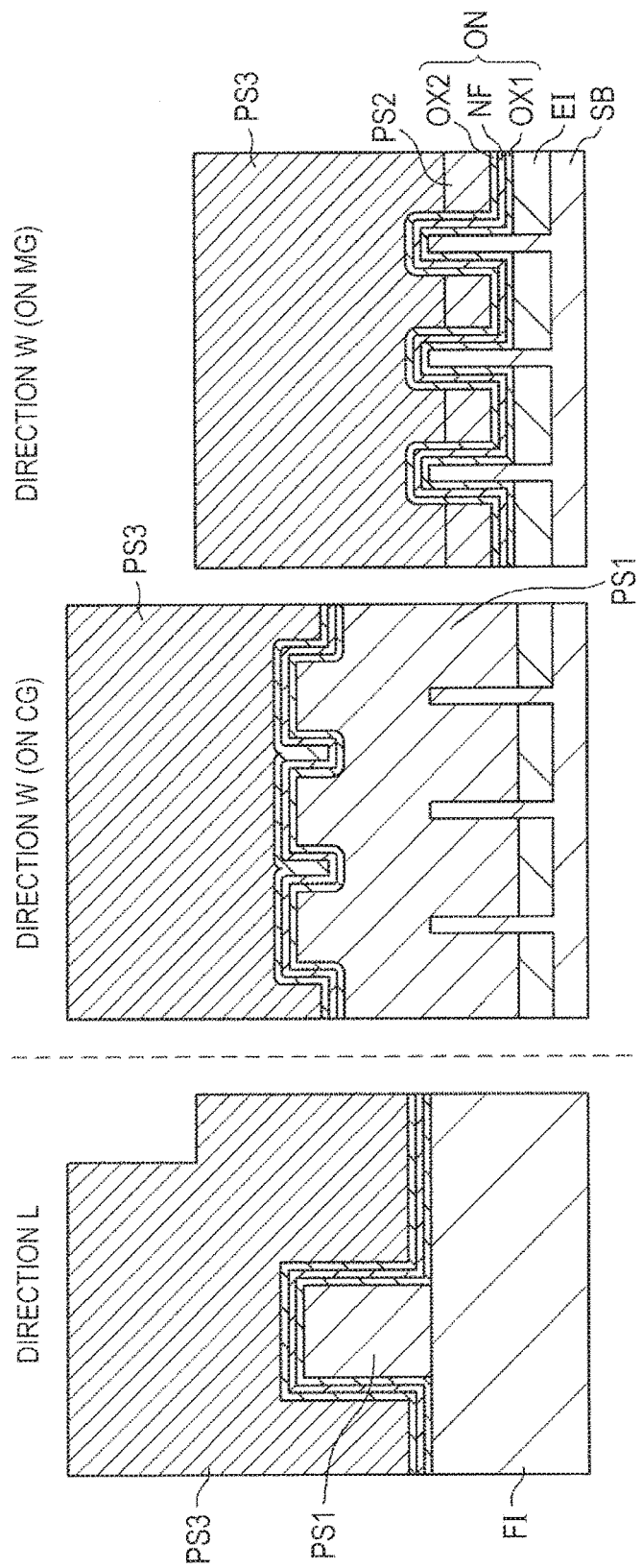
FIG. 18 is a cross-sectional view showing a process of manufacturing the semiconductor device following that of FIG. 17.

Next, as shown in FIG. 18, a second-layer polysilicon film PS3 is formed on the main surface of the semiconductor substrate SB. At this time, the impurity concentration of the second-layer polysilicon film PS3 is made different from that of the first-layer polysilicon film PS2, because when the second-layer polysilicon film PS3 is removed by wet etching, which will be described later referring to FIG. 24, removal of the first-layer polysilicon film PS2 is prevented by imparting the second-layer polysilicon film PS3 with adequate selectivity to the first-layer polysilicon film PS2.

Figure 19:
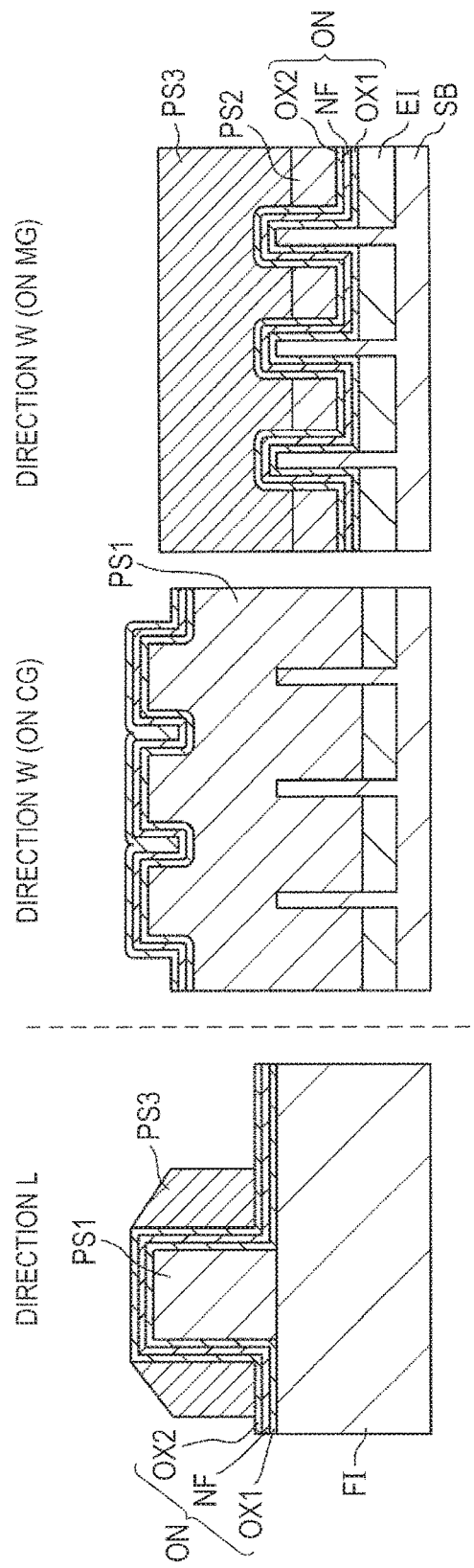
FIG. 19 is a cross-sectional view showing a process of manufacturing the semiconductor device following that of FIG. 18.

Then, as shown in FIG. 19, the second-layer polysilicon film PS3 is processed by dry etching to form a sidewall-shaped MG pattern (memory gate electrode MG pattern) on both side surfaces of the polysilicon film PS1 which will be a control gate electrode CG.

Figure 20:
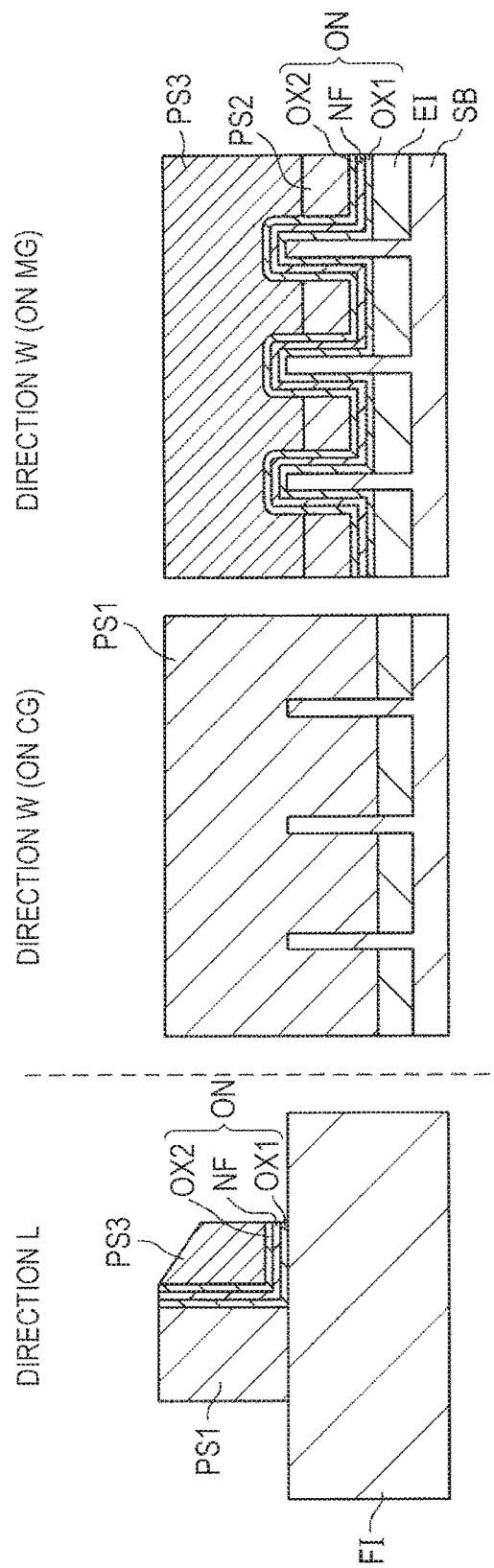
FIG. 20 is a cross-sectional view showing a process of manufacturing the semiconductor device following that of FIG. 19.

Next, as shown in FIG. 20, a resist is selectively patterned on one of the sidewall-shaped MG patterns, the other MG pattern (pattern not covered with the resist pattern) is removed by dry etching, and then, the ONO film ON exposed from the semiconductor substrate SB and the polysilicon film PS1 is removed.

Figure 21:
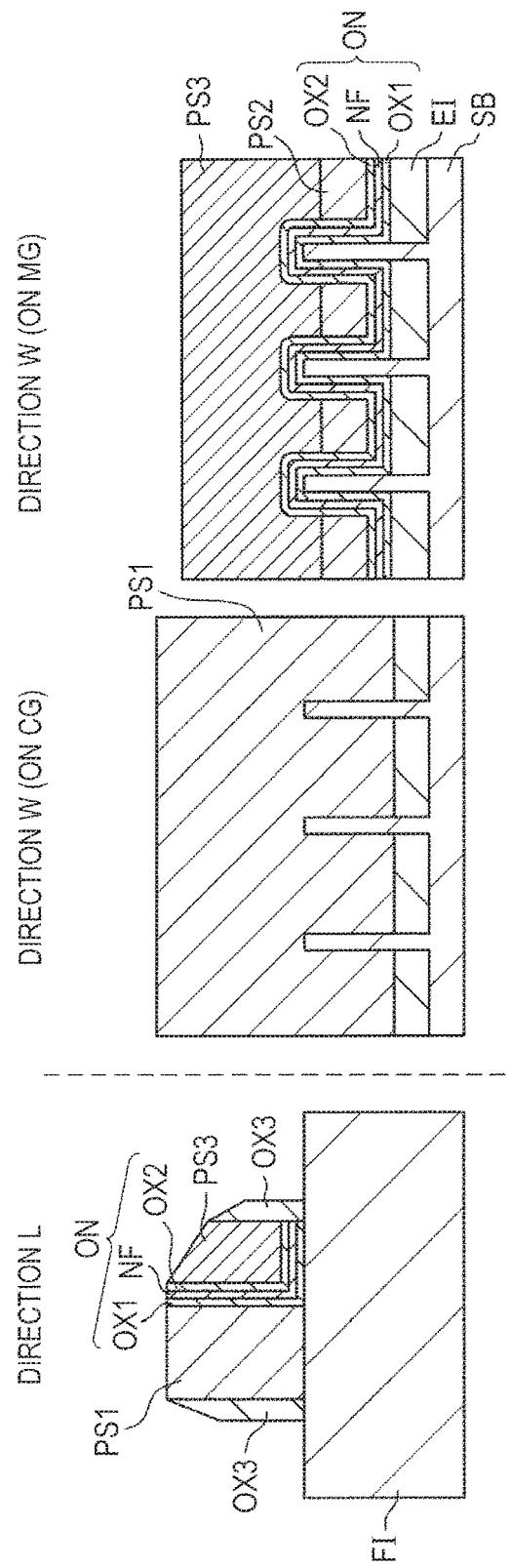
FIG. 21 is a cross-sectional view showing a process of manufacturing the semiconductor device following that of FIG. 20.

Next, as shown in FIG. 21, an insulating film made of, for example, a silicon oxide film OX3 is formed on the main surface of the semiconductor substrate SB and by anisotropic dry etching, a sidewall is formed on the side surface of the polysilicon film PS1 which will be a control gate electrode CG and on the side surface of the MG pattern (PS3).

Figure 22:
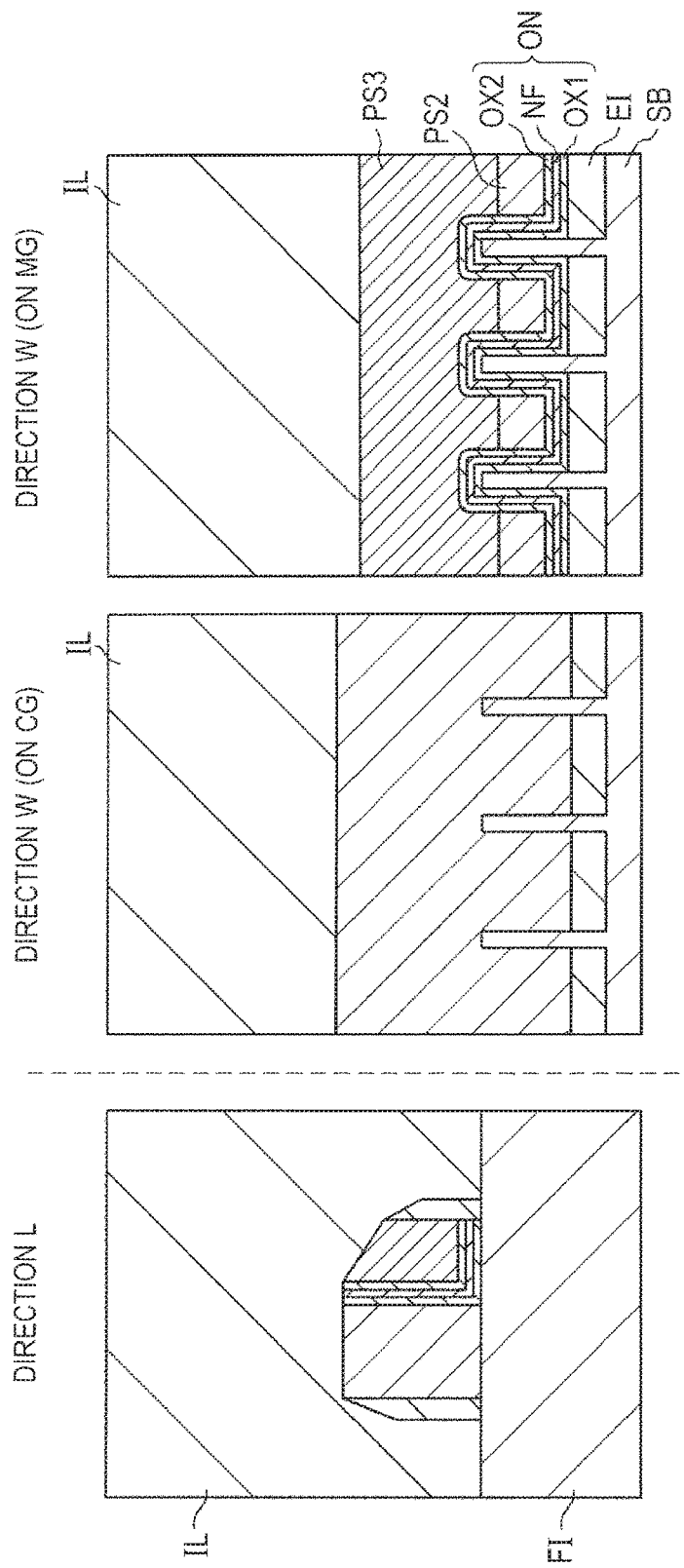
FIG. 22 is a cross-sectional view showing a process of manufacturing the semiconductor device following that of FIG. 21.

Then, as shown in FIG. 22, a silicon oxide film such as P-TEOS film which will be an interlayer insulating film IL is formed on the main surface of the semiconductor substrate SB.

Figure 23:
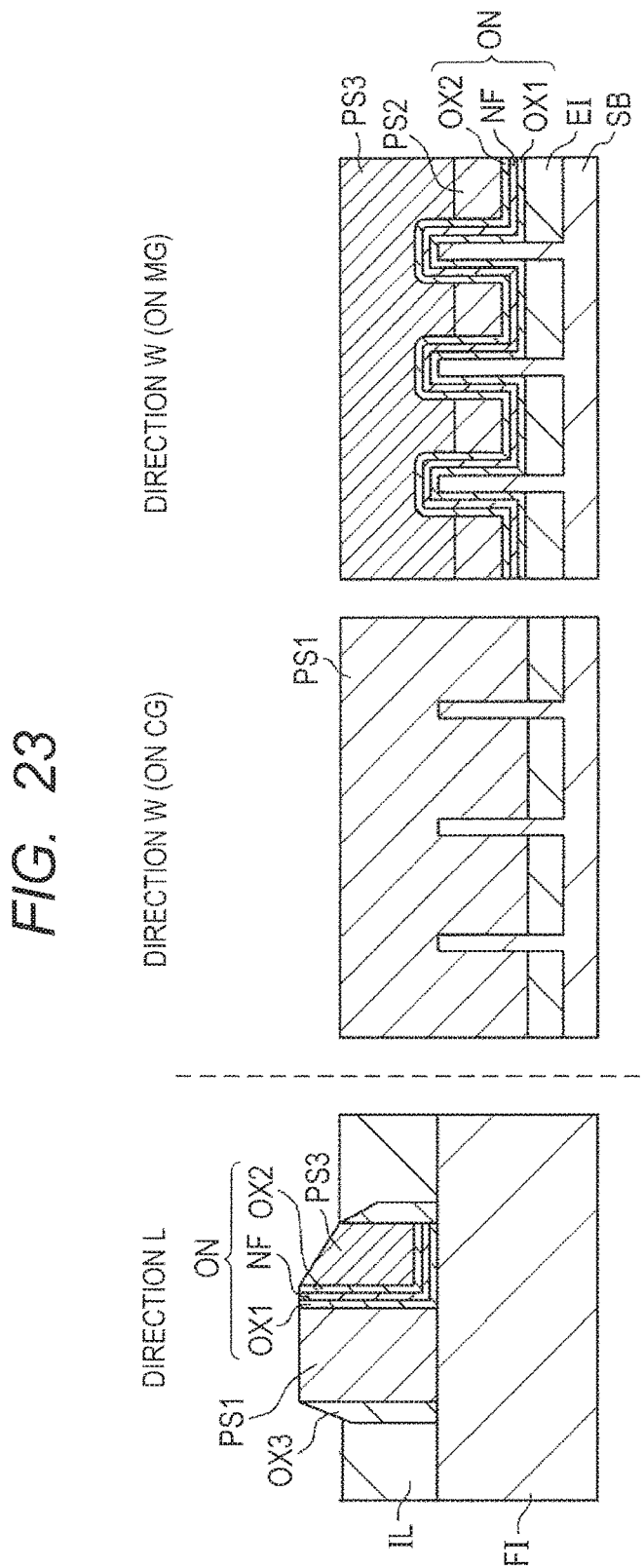
FIG. 23 is a cross-sectional view showing a process of manufacturing the semiconductor device following that of FIG. 22.
Figure 24:
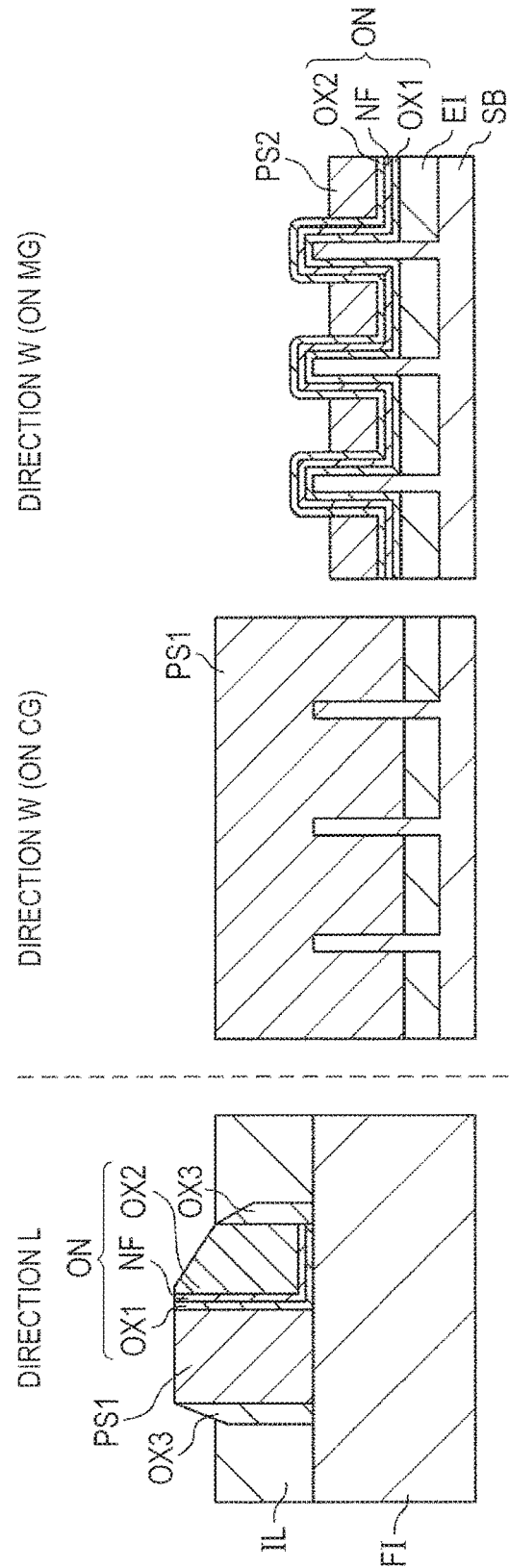
FIG. 24 is a cross-sectional view showing a process of manufacturing the semiconductor device following that of FIG. 23.

Next, as shown in FIG. 23, the interlayer insulating film IL is polished by CMP to expose the second-layer polysilicon film PS3.

Next, the second-layer polysilicon film PS3 is removed by wet etching with a chemical, for example, aqueous ammonia (aqueous $NH_3$).

Figure 25:
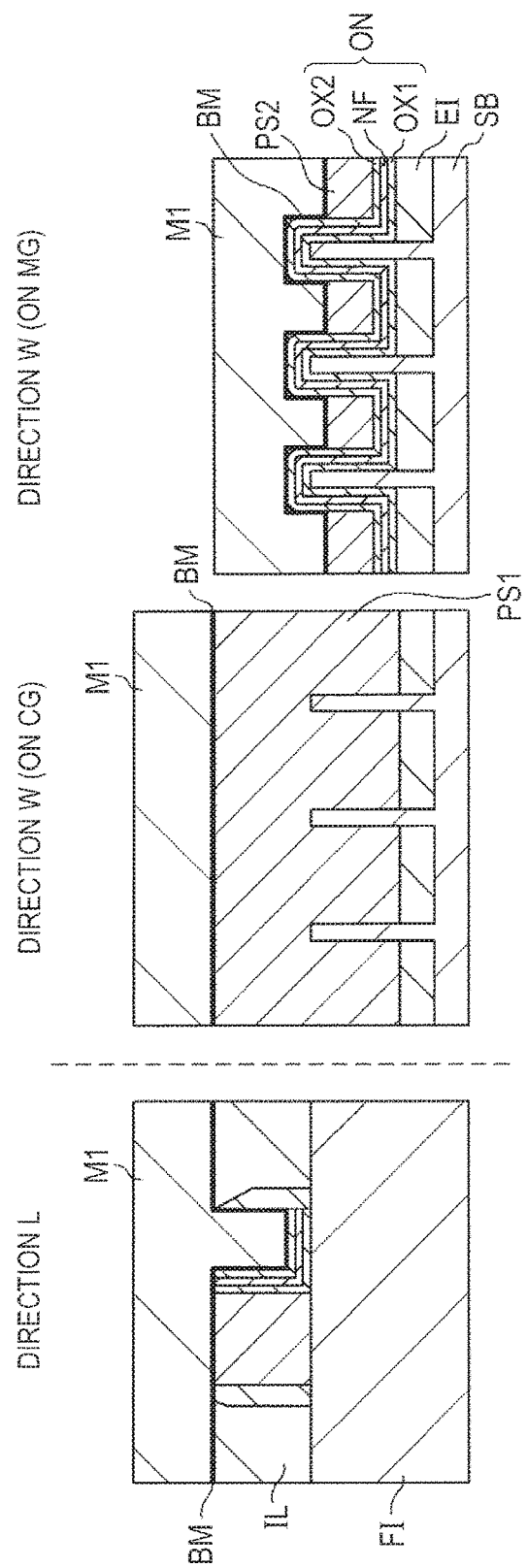
FIG. 25 is a cross-sectional view showing a process of manufacturing the semiconductor device following that of FIG. 24.

Then, as shown in FIG. 25, a barrier metal BM and a metal film M1 for the memory gate electrode MG2 are formed on the main surface of the semiconductor substrate SB in order of mention from the lower layer side. At this time, a portion formed as a result of removal of the second-layer polysilicon film PS3 is filled with the barrier metal BM and the metal film for the memory gate electrode MG2. This barrier metal BM functions as a diffusion preventive film when aluminum or the like is used for a base protective film or the metal film for the memory gate electrode MG2 and in addition functions as a work function control film for adjusting the work function (threshold voltage Vth) by changing a ratio of the film thickness of the barrier metal BM to the film thickness of the metal film M1 for the memory gate electrode MG2. The threshold voltage Vth of the memory gate electrode MG2 can be increased by selecting a material having a work function as large as possible from the metal gate electrode materials shown in FIG. 11 and adjusting the ratio of the film thickness of the barrier metal BM to the film thickness of the metal film M1 for the memory gate electrode MG2.

The work function is desirably 5 eV or more. By forming a high-k film below the metal film M1 for the memory gate electrode MG2, the threshold voltage Vth of the memory gate electrode MG2 can be made higher.

Figure 26:
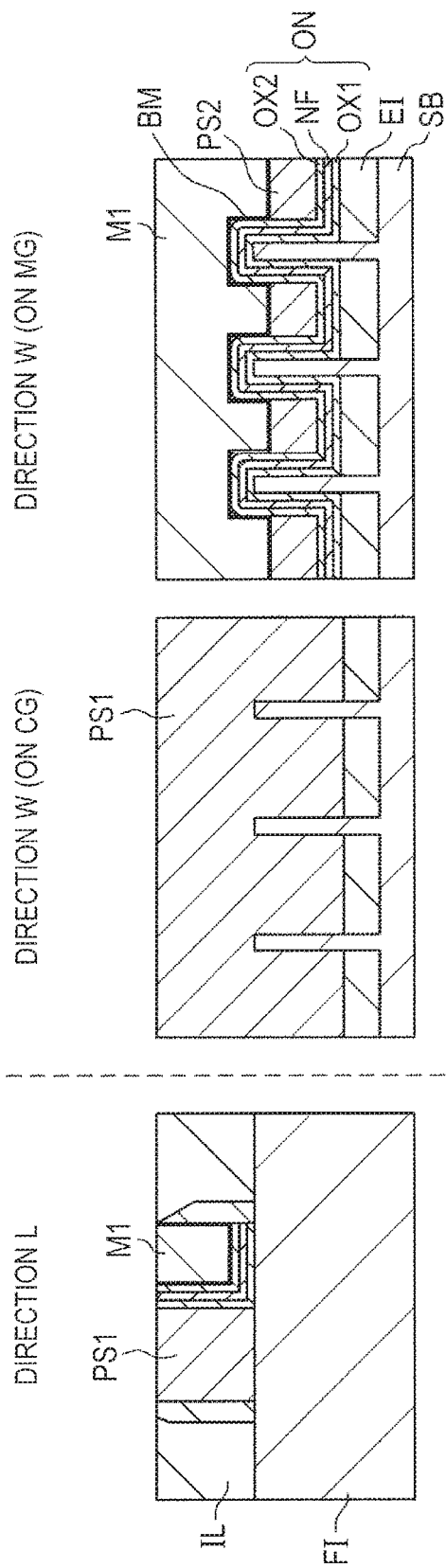
FIG. 26 is a cross-sectional view showing a process of manufacturing the semiconductor device following that of FIG. 25.

Next, as shown in FIG. 26, an unnecessary portion of the metal film M1 is removed by metal CMP to obtain the memory gate electrode MG2 having, as an upper portion thereof, a metal gate structure.

Figure 27:
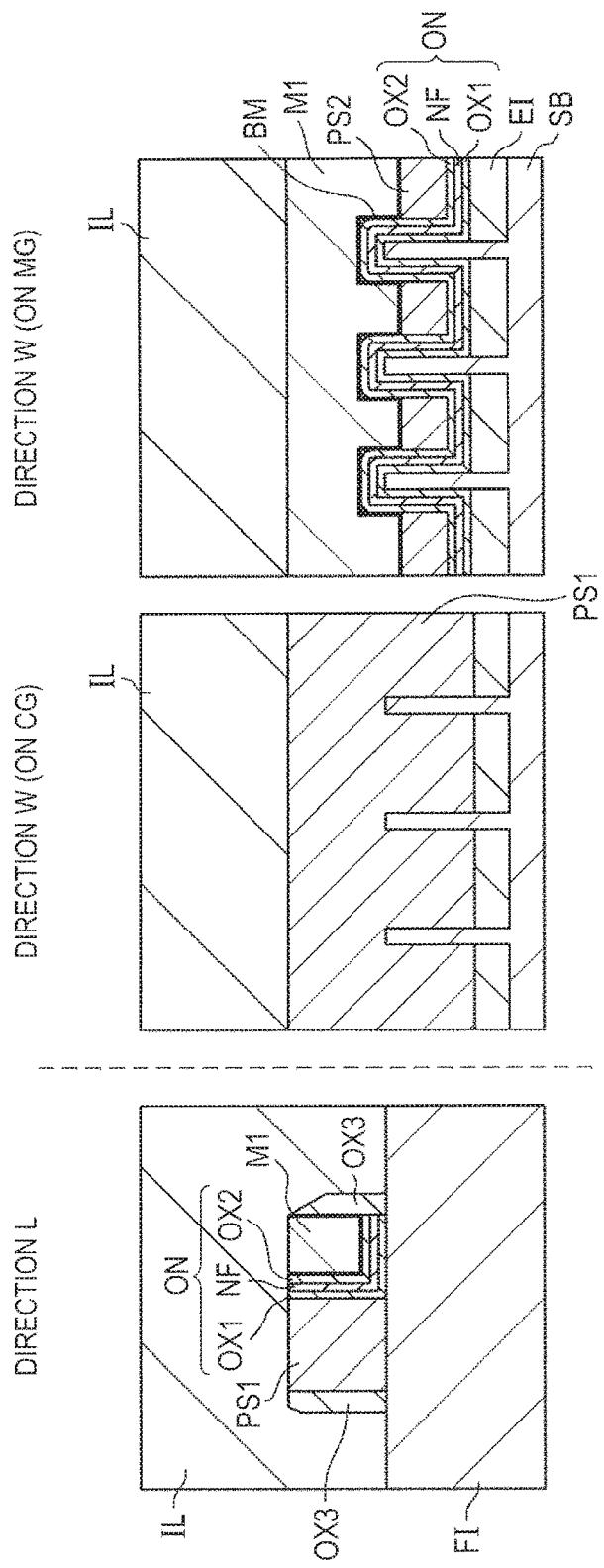
FIG. 27 is a cross-sectional view showing a process of manufacturing the semiconductor device following that of FIG. 26.

In the end, as shown in FIG. 27, an interlayer insulating film IL is formed on the main surface of the semiconductor substrate SB to complete the memory gate electrode MG of the present example shown in FIG. 8.

Figure 28:
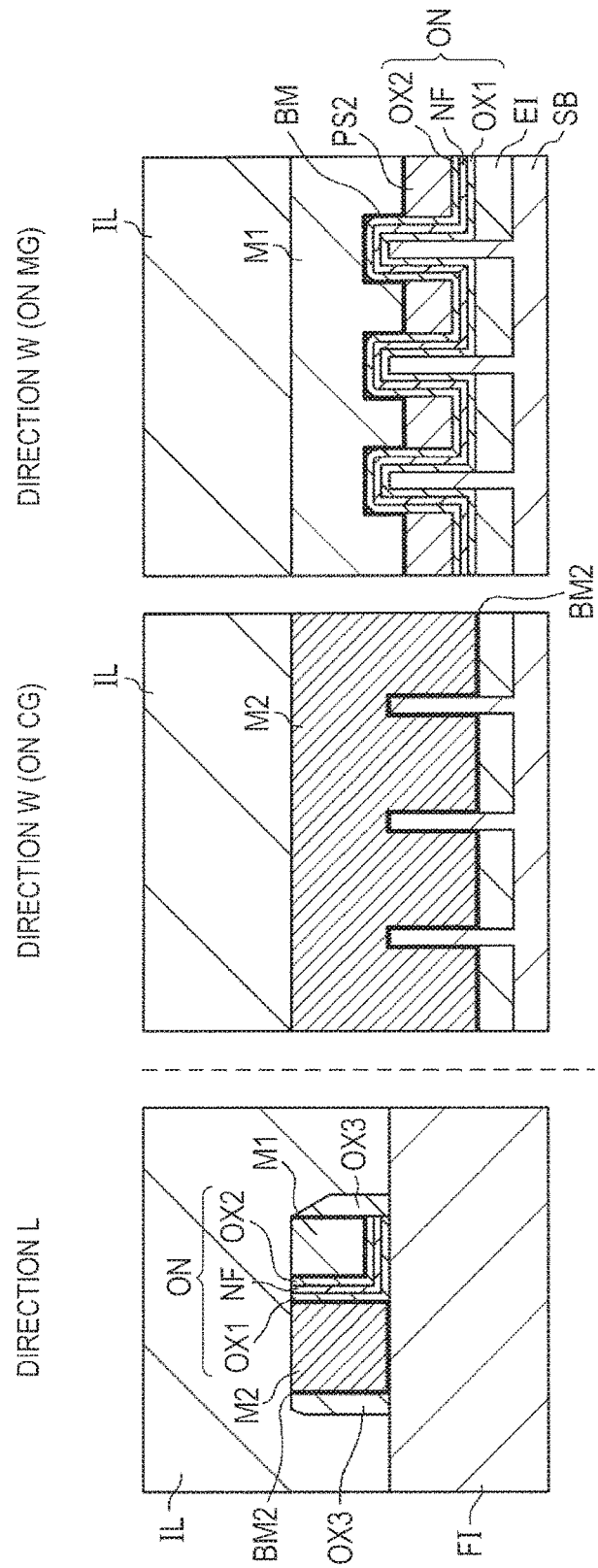
FIG. 28 shows a modification example of FIG. 27.

FIG. 13 to FIG. 27 show an example of obtaining a control gate electrode CG made of polysilicon, but the control gate electrode CG may have a metal gate structure comprised of a barrier metal BM2 and a metal film M2 as shown in FIG. 28.

Figure 29:
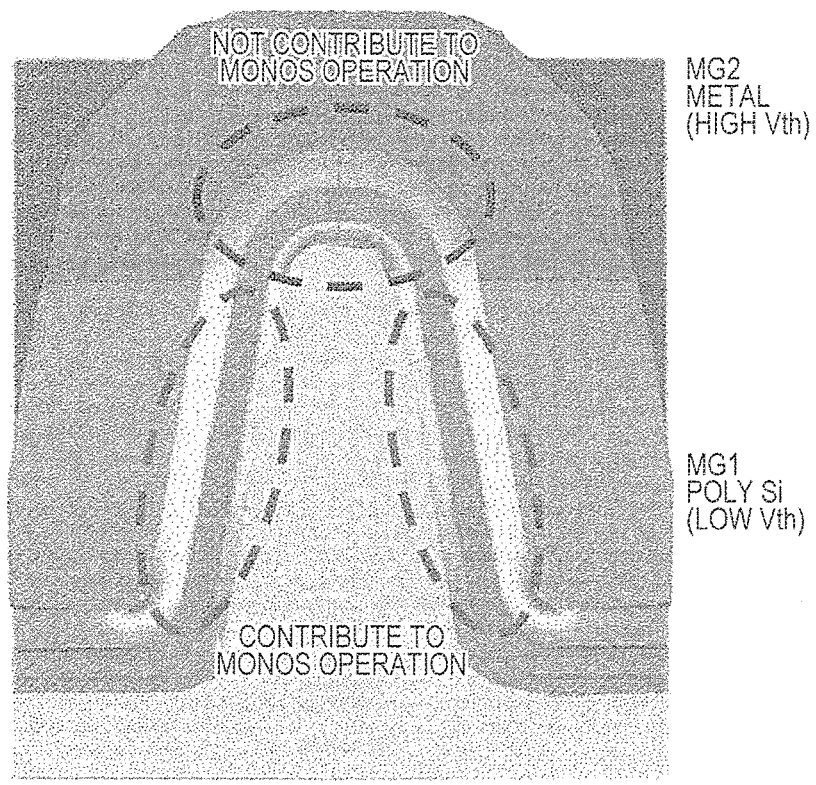
FIG. 29 schematically shows the effect of the semiconductor device according to First Embodiment (Example 1) of the invention.

The effect and advantage of the present example will be described referring to FIG. 29. In the semiconductor device of the present example having a nonvolatile memory, as described above, the memory gate electrode MG has a two-layer structure with, as a lower layer, the memory gate electrode MG1 (first gate electrode) adjacent to the side surface of the fin via the ONO film and, as an upper layer, the memory gate electrode MG2 (second gate electrode) adjacent to the upper surface of the fin via the ONO film. The memory gate electrode MG1 and the memory gate electrode MG2 are made of electrode materials different from each other. In the present example, the memory gate electrode MG1 is made of polysilicon having a relatively low threshold voltage Vth, while the memory gate electrode MG2 is made of a metal film having a relatively high threshold voltage. In addition, the boundary surface between the memory gate electrode MG1 and the memory gate electrode MG2 is located below the upper surface of the fin (on the side of the main surface of the semiconductor substrate SB).

According to this structure, the memory gate electrode MG2 does not contribute to the operation of the MONOS and only the memory gate electrode MG1 contributes to the operation of the MONOS. This makes it possible to allow the portion on which the electric field concentrates (the place in the vicinity of the upper portion of the fin) to be a region not used during memory operation and deterioration in the ONO film due to rewriting can be suppressed.

Example 2

Referring to FIG. 9 and FIGS. 30 to 38, a semiconductor device of Example 2 having a nonvolatile memory and a method of manufacturing the device will be described. The present example is a modification example of Example 1 and FIG. 9 corresponds to FIG. 8 of Example 1. The semiconductor device of the present example is different from that of Example 1 in that the memory gate electrode MG2 of Example 1 (FIG. 8) is a metal gate electrode made of a metal material, while a memory gate electrode on the upper side is made of a metal silicide obtained by siliciding polysilicon with a metal element. The other configuration is similar to that of Example 1.

Figure 9:
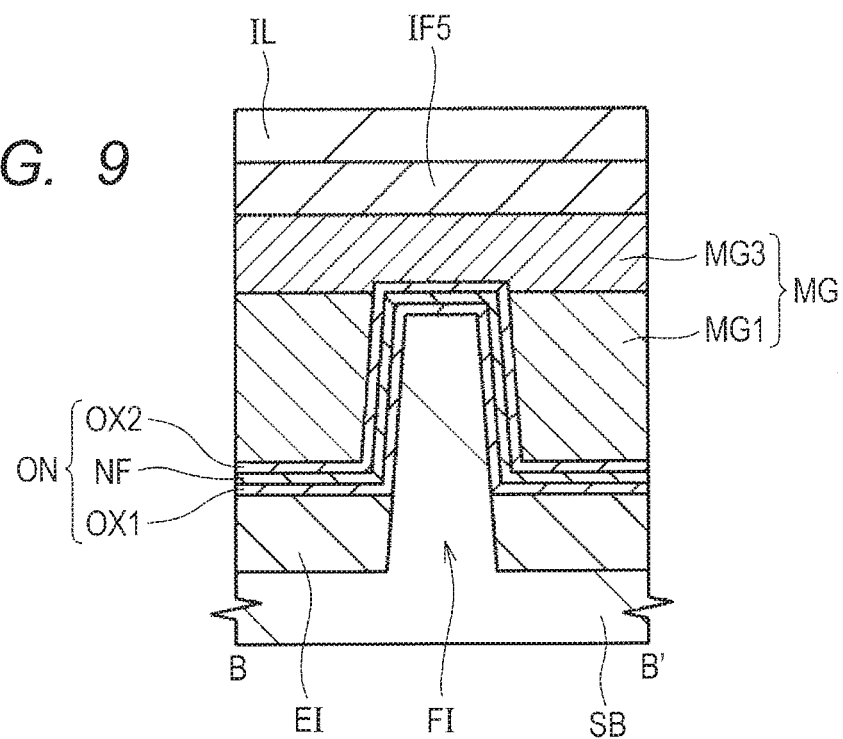
FIG. 9 is a cross-sectional view showing a portion of a semiconductor device according to First Embodiment (Example 2) of the present invention.

As shown in FIG. 9, the memory gate electrode MG has a two-layer structure with, as a lower layer, a memory gate electrode MG1 (first gate electrode) adjacent to the side surface of a fin FI via an ONO film ON and, as an upper layer, a memory gate electrode MG3 (second gate electrode) adjacent to the upper surface of the fin FI via the ONO film ON. The memory gate electrode MG1 is made of polysilicon having a relatively low threshold voltage Vth and the memory gate electrode MG3 is made of a metal silicide film having a relatively high threshold voltage. In addition, the boundary surface between the memory gate electrode MG1 and the memory gate electrode MG3 is located below the upper surface of the fin FI (on the side of the main surface of the semiconductor substrate SB).

According to this structure, the memory gate electrode MG3 does not contribute to the operation of the MONOS and only the memory gate electrode MG1 contributes to the operation of the MONOS. This makes it possible to allow the portion on which the electric field concentrates (the place in the vicinity of the upper portion of the fin) to be a region not used during memory operation and deterioration in the ONO film due to rewriting can be suppressed.

Referring to FIGS. 30 to 38, a method of manufacturing the semiconductor device of the present example will be described. It is to be noted that the manufacturing method of the present example includes processes similar to those of Example 1 shown in FIGS. 13 to 17 (until the step of dry etching the first-layer polysilicon film PS2) so that differences from the drawings on and after FIG. 17 of Example 1 will be described mainly.

Figure 30:
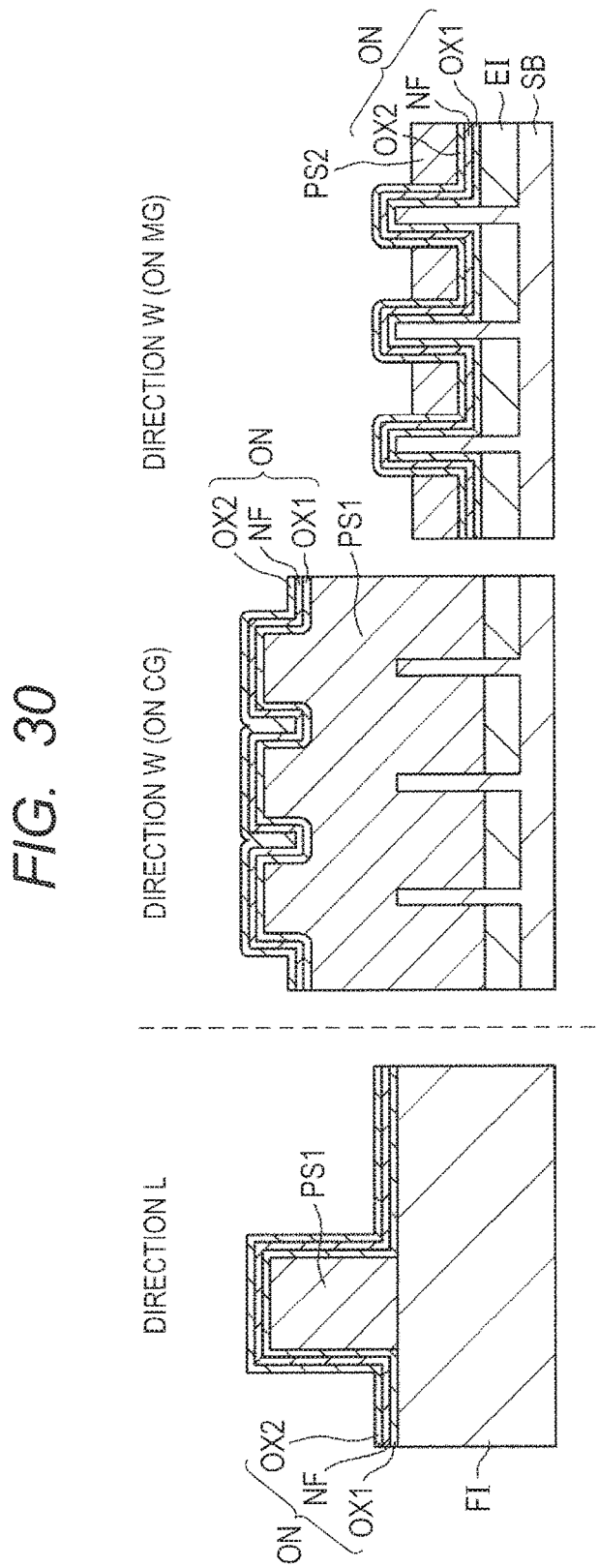
FIG. 30 is a cross-sectional view showing a process of manufacturing the semiconductor device according to First Embodiment (Example 2) of the invention.

First, as shown in FIG. 30 (corresponding to FIG. 17 of Example 1), the first-layer polysilicon film PS2 is removed by dry etching. This dry etching is performed by adjusting the etching conditions so that the upper portion of the first-layer polysilicon film PS2 thus etched is located below the upper portion (top portion) of the fin FI (located on the side of the main surface of the semiconductor substrate).

Figure 31:
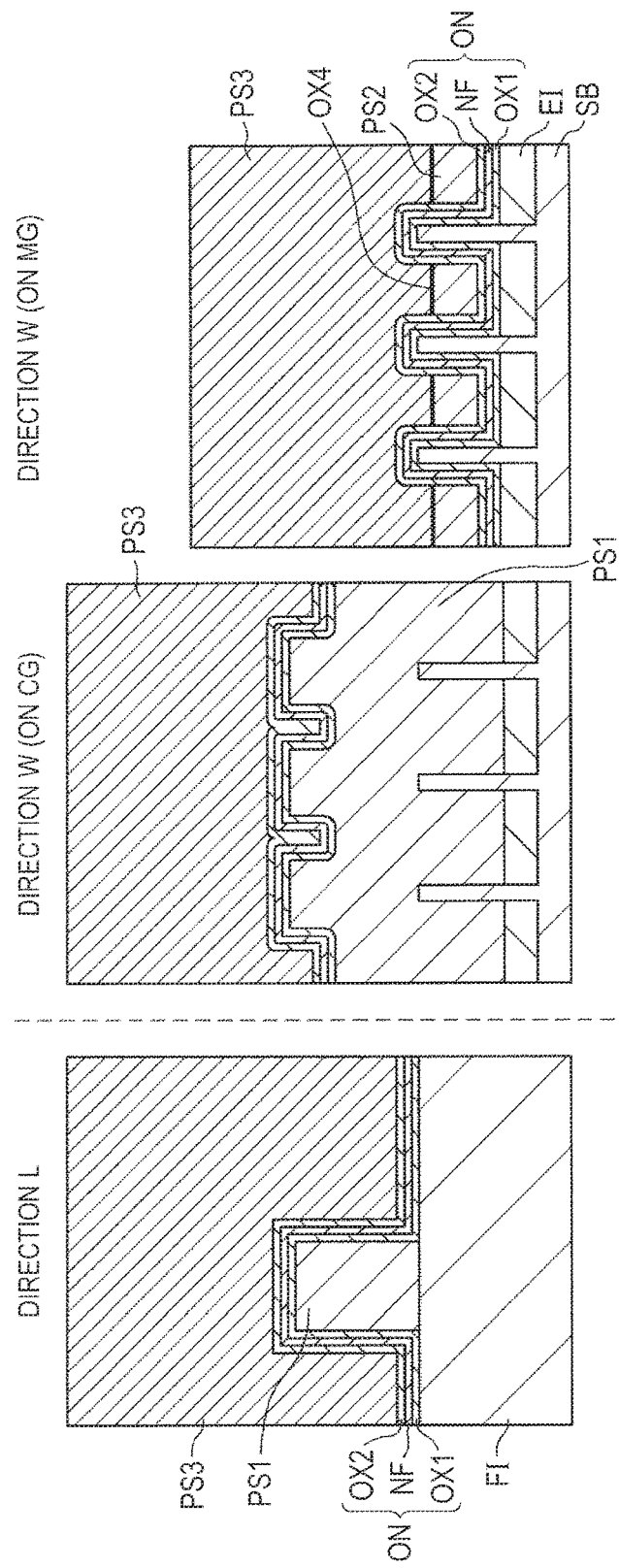
FIG. 31 is a cross-sectional view showing a process of manufacturing the semiconductor device following that of FIG. 30.

Then, as shown in FIG. 31, after formation of a silicon oxide film OX4 having a small thickness, a second-layer polysilicon film PS3 is formed on the main surface of the semiconductor substrate SB. This thin silicon oxide film OX4 is formed to prevent silicidation of the first-layer polysilicon film PS2 when the second-layer polysilicon film PS3 is silicided in a step described later.

Figure 32:
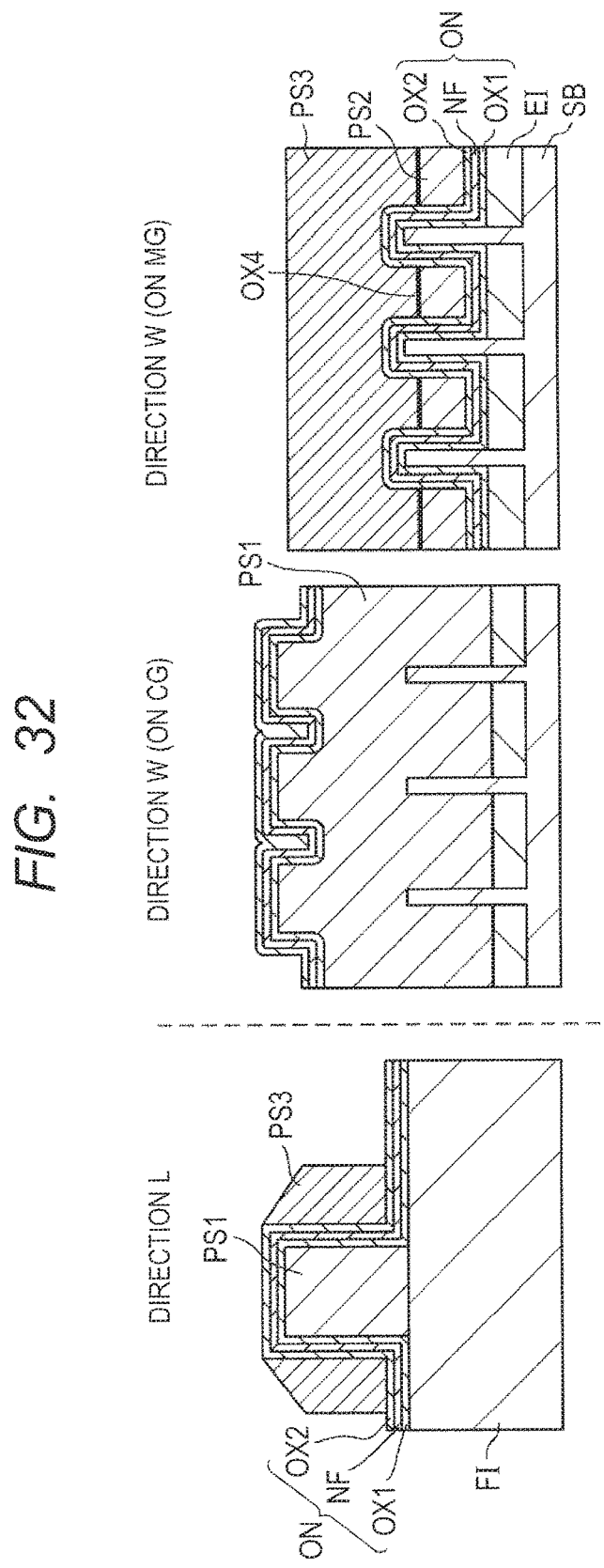
FIG. 32 is a cross-sectional view showing a process of manufacturing the semiconductor device following that of FIG. 31.

Next, as shown in FIG. 32, the second-layer polysilicon film PS3 is processed by dry etching to form sidewall-shaped MG pattern (memory gate electrode MG pattern) on both side surfaces of the polysilicon film PS1 which will be a control gate electrode CG.

Figure 33:
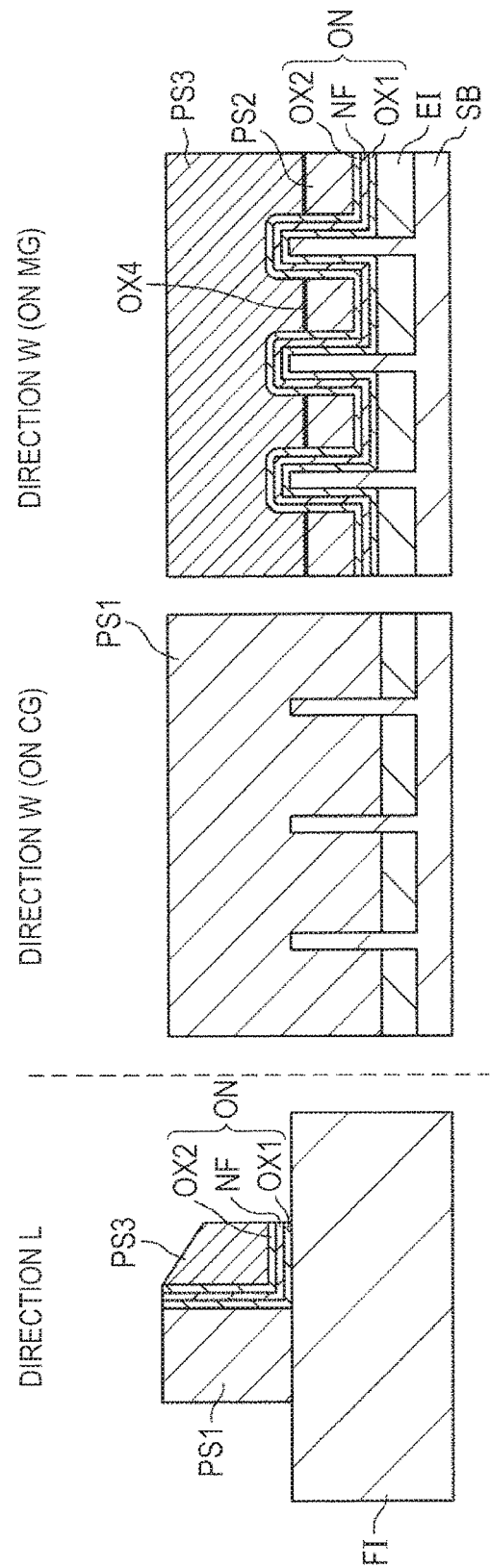
FIG. 33 is a cross-sectional view showing a process of manufacturing the semiconductor device following that of FIG. 32.

Next, as shown in FIG. 33, a resist is patterned selectively on one of the sidewall-shaped MG patterns and the other MG pattern (the pattern not covered with the resist pattern) is removed by dry etching. Then, the ONO film ON exposed from the semiconductor substrate SB and the polysilicon film PS1 are removed.

Figure 34:
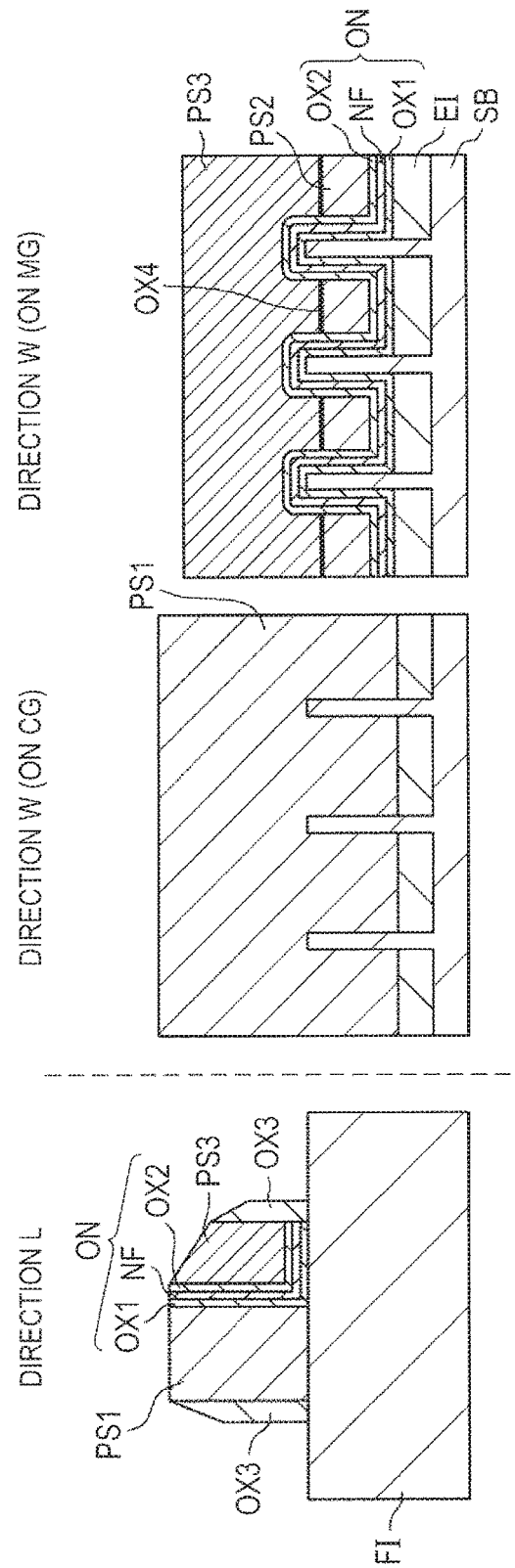
FIG. 34 is a cross-sectional view showing a process of manufacturing the semiconductor device following that of FIG. 33.

Then, as shown in FIG. 34, for example, an insulating film made of a silicon oxide film OX3 is formed on the main surface of the semiconductor substrate SB and then anisotropic dry etching is performed to form a sidewall on the side surface of the polysilicon film PS1 which will be a control gate electrode CG and on the side surface of the MG pattern (PS3).

Figure 35:
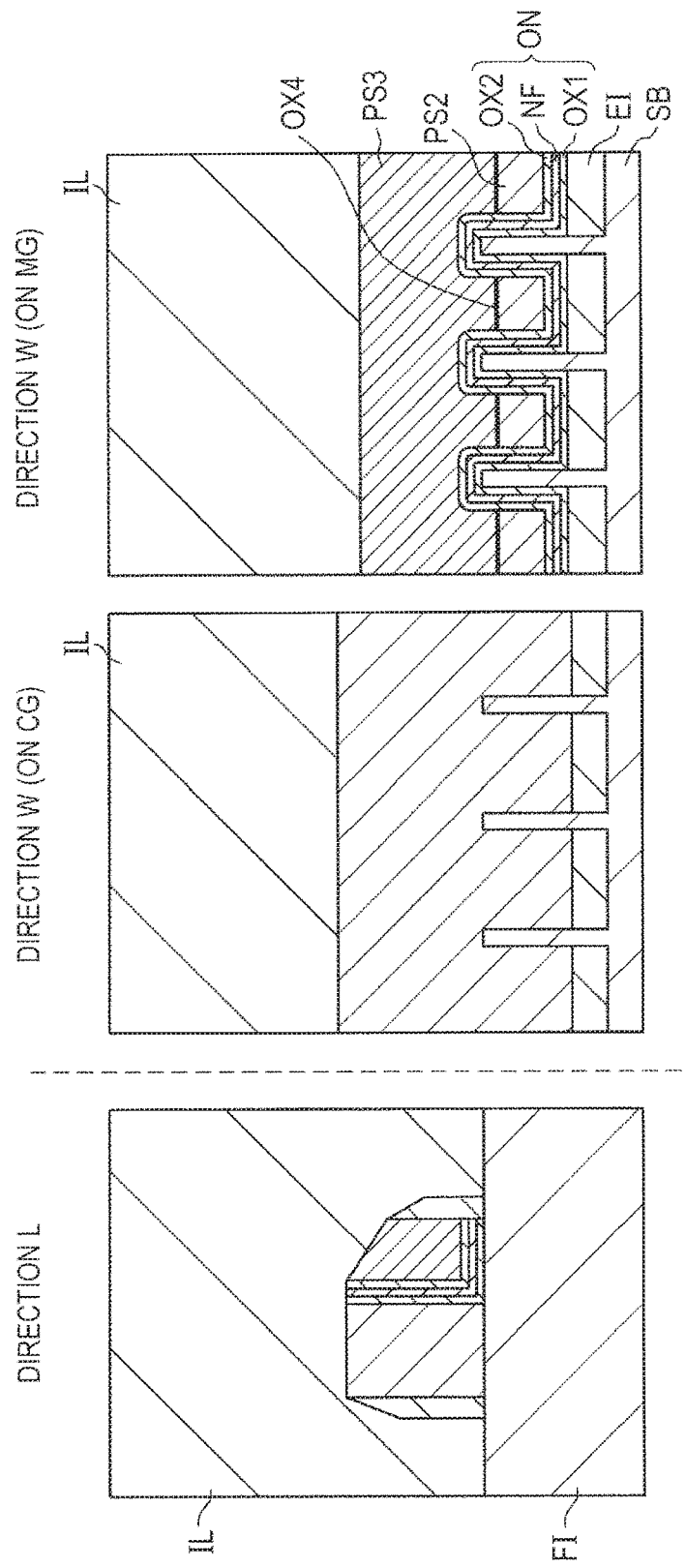
FIG. 35 is a cross-sectional view showing a process of manufacturing the semiconductor device following that of FIG. 34.

Next, as shown in FIG. 35, a silicon oxide film such as P-TEOS film which will be an interlayer insulating film IL is formed on the main surface of the semiconductor substrate SB.

Figure 36:
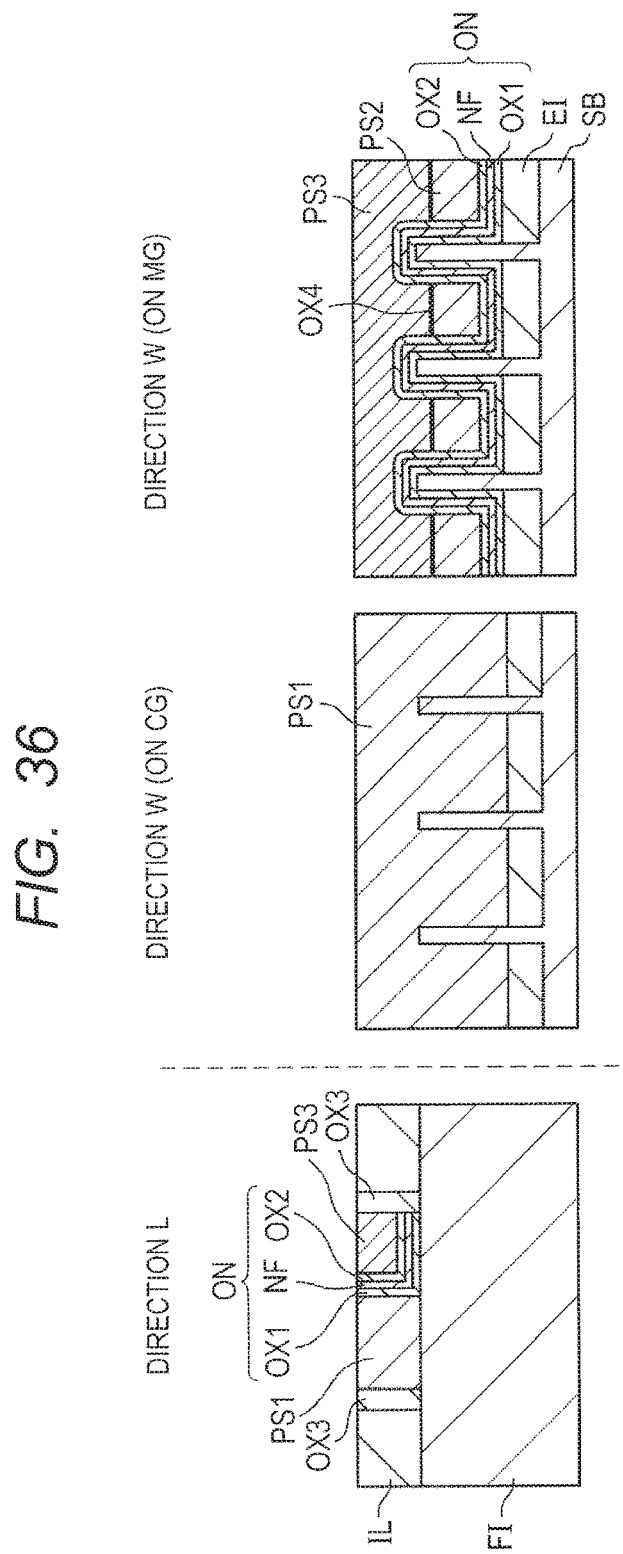
FIG. 36 is a cross-sectional view showing a process of manufacturing the semiconductor device following that of FIG. 35.

Next, as shown in FIG. 36, the interlayer insulating film IL is polished and removed by chemical mechanical polishing CMP. At this time, polishing is performed while preventing the height of the second-layer polysilicon film PS3 from becoming higher than the upper portion (top portion) of the fin FI, because it enables the upper portion (top portion) of the fin FI to be covered with silicide when the second-layer polysilicon film PS3 is fully silicided in the next step (FIG. 37).

Figure 37:
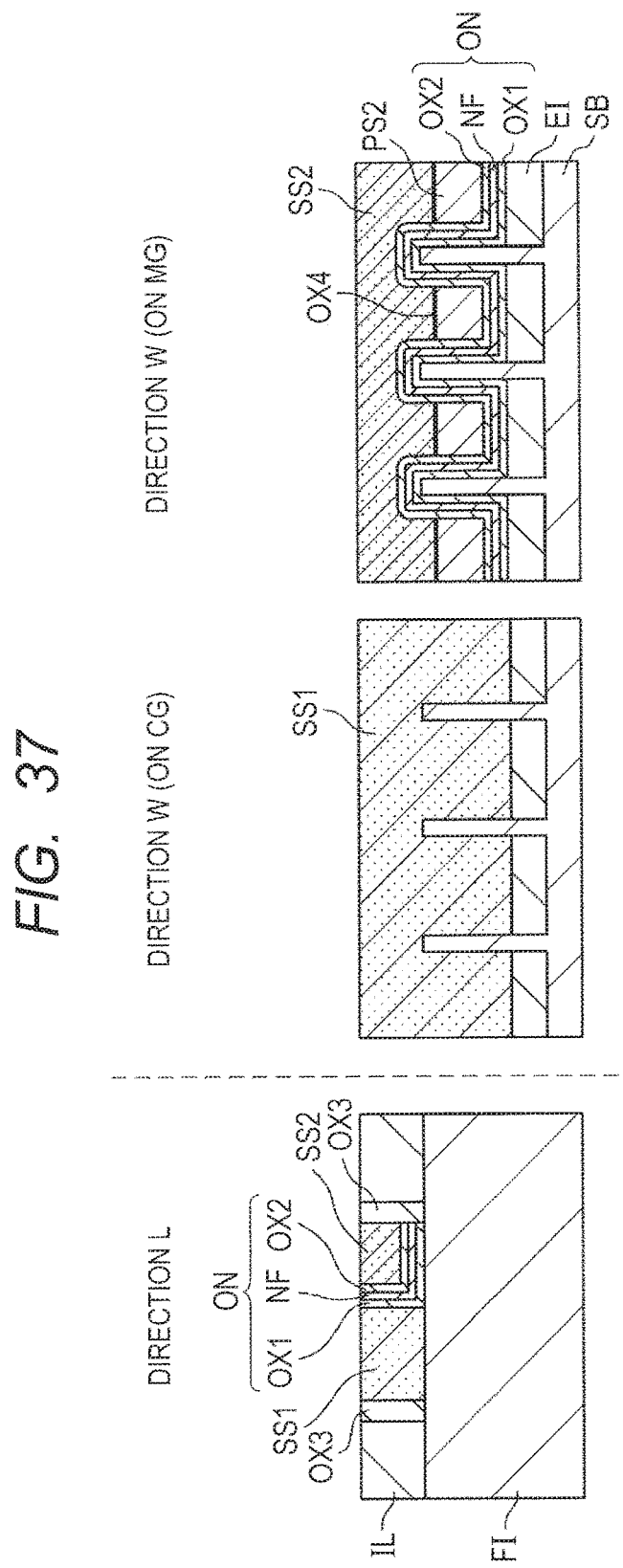
FIG. 37 is a cross-sectional view showing a process of manufacturing the semiconductor device following that of FIG. 36.

Then, as shown in FIG. 37, the polysilicon film PS1 and the polysilicon film PS3 are silicided. This silicidation is performed using a metal element, for example, molybdenum (Mo), tungsten (W), titanium (Ti), cobalt (Co), or nickel.

Figure 38:
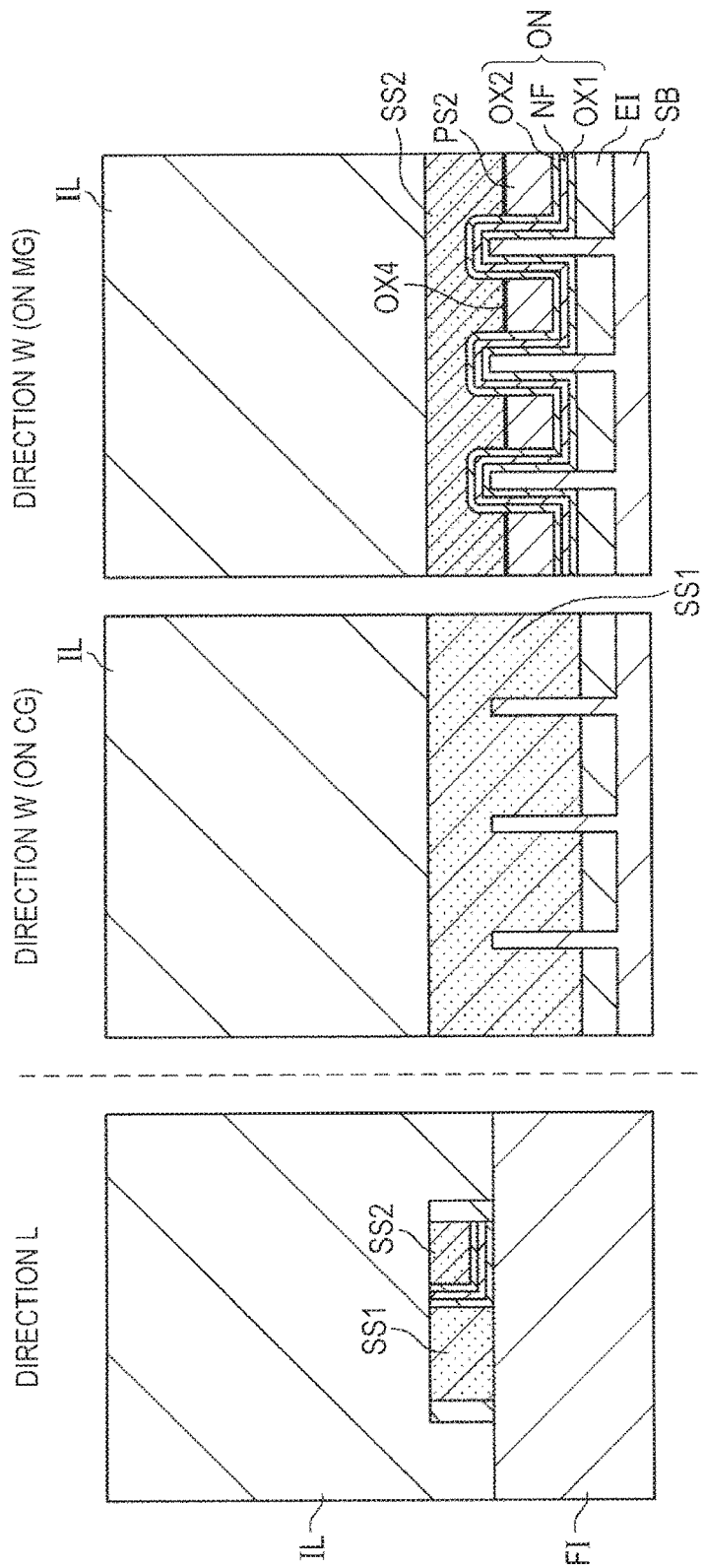
FIG. 38 is a cross-sectional view showing a process of manufacturing the semiconductor device following that of FIG. 37.

Finally, as shown in FIG. 38, an interlayer insulating film IL is formed on the main surface of the semiconductor substrate SB to complete the memory gate electrode MG of the present example shown in FIG. 9.

Example 3

Figure 10:
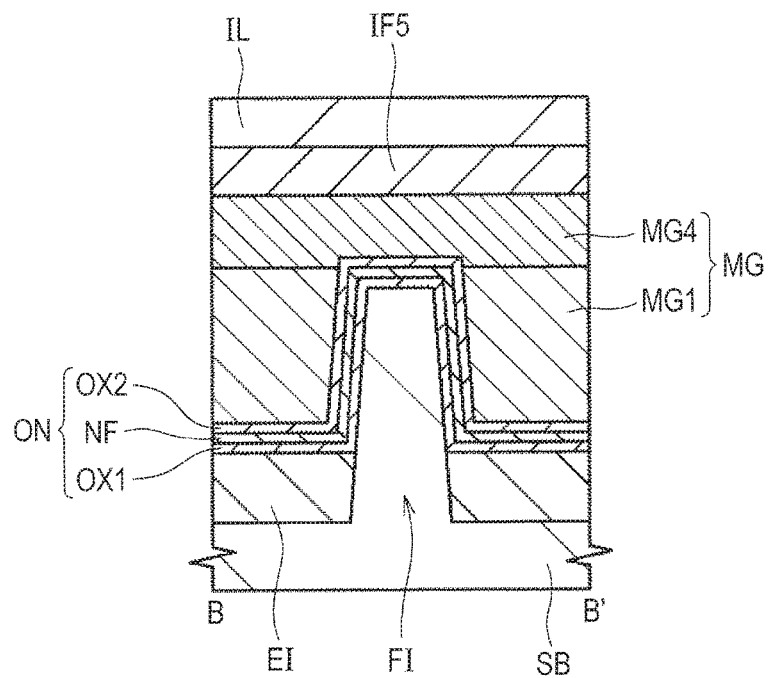
FIG. 10 is a cross-sectional view showing a portion of a semiconductor device according to First Embodiment (Example 3) of the present invention.

Referring to FIG. 10, a semiconductor device of Example 3 having a nonvolatile memory will be described. The present example is a modification example of Example 1 and FIG. 10 corresponds to FIG. 8 of Example 1. The semiconductor device of the present example is different from that of Example 1 in that the memory gate electrode MG of Example 1 (FIG. 8) has a two-layer structure with, as a lower layer, a memory gate electrode MG1 made of a polysilicon film and, as an upper layer, a memory gate electrode MG2 made of a metal material, while in the present example, the memory gate electrode MG1 on the lower side and the memory gate electrode MG4 on the upper side are made of electrode materials different in work function, respectively. The other configuration is similar to that of Example 1.

As shown in FIG. 10, the memory gate electrode MG is comprised of a two-layer structure with, as a lower layer, a memory gate electrode MG1 (first gate electrode) adjacent to the side surface of a fin FI via an ONO film ON and, as an upper layer, a memory gate electrode MG4 (second gate electrode) adjacent to the upper surface of the fin FI via the ONO film ON. The memory gate electrode MG1 is made of a gate electrode material having a relatively low work function and the memory gate electrode MG4 is made of a gate electrode material having a relatively high work function. In addition, the boundary surface between the memory gate electrode MG1 and the memory gate electrode MG4 is located below the upper surface of the fin FI (on the side of the main surface of the semiconductor substrate SB).

As the gate electrode material of the memory gate electrode MG1 or the memory gate electrode MG4, polysilicon or metal gate electrode material is selected. When the memory gate electrode MG1 and the memory gate electrode MG4 are both made of polysilicon, their work functions (threshold voltages Vth) are adjusted by using respectively different impurity concentrations. When the memory gate electrode MG1 and the memory gate electrode MG4 are both made of a metal gate electrode material, their work functions (threshold voltages Vth) are adjusted by selecting metal gate electrode materials having a desired work function from the gate electrode materials shown in FIG. 11.

According to this structure, the memory gate electrode MG4 does not contribute to the operation of the MONOS and only the memory gate electrode MG1 contributes to the operation of the MONOS. This makes it possible to allow the portion on which an electric field concentrates (place in the vicinity of the upper portion of the fin) to be a region not used during memory operation and deterioration in the ONO film due to rewriting can be suppressed.

In the present example, the threshold voltage Vth in the direction along the fin FI can be controlled because selected gate electrode materials (polysilicon or metal gate electrode materials) are used for the memory gate electrode MG1 and the memory gate electrode MG4.

Example 4

Figure 39:
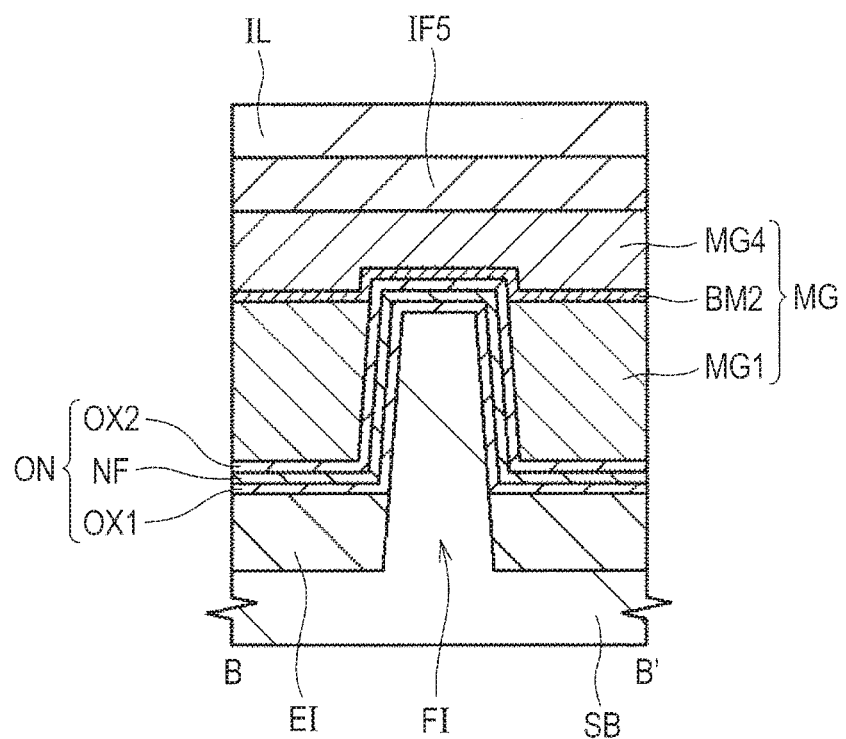
FIG. 39 is a cross-sectional view showing a portion of a semiconductor device according to First Embodiment (Example 4) of the invention.

Referring to FIG. 39, a semiconductor device of Example 4 having a nonvolatile memory will be described. The present example is a modification example of Example 1 and FIG. 39 corresponds to FIG. 8 of Example 1. The semiconductor device of the present example is different from that of Example 1 in that the memory gate electrode MG of Example 1 (FIG. 8) has a two-layer structure with, as a lower layer, a memory gate electrode MG1 made of a polysilicon film and, as an upper layer, a memory gate electrode MG2 made of a metal material, while a memory gate electrode MG of the present example has a barrier metal BM2 for controlling the work function between the memory gate electrode MG1 and the memory gate electrode MG2. The other configuration is similar to that of Example 1.

As shown in FIG. 39, the memory gate electrode MG has a two-layer structure with, as a lower layer, a memory gate electrode MG1 (first gate electrode) adjacent to the side surface of a fin FI via an ONO film ON and, as an upper layer, a memory gate electrode MG2 (second gate electrode) adjacent to the upper surface of the fin FI via the ONO film ON. The memory gate electrode MG1 is made of polysilicon having a relatively low threshold voltage Vth and the memory gate electrode MG2 is made of a metal film having a relatively high threshold voltage. In addition, the memory gate electrode MG1 and the memory gate electrode MG2 have therebetween a barrier metal BM2 for controlling the work function. This barrier metal BM2 is made of, for example, a tantalum nitride film (TaN) or a titanium nitride film (TiN).

As the material of the barrier metal BM2 for controlling the work function and the memory gate electrode MG2, it is preferred to use a material selected from aluminum (Al), titanium (Ti), tantalum (Ta), ruthenium (Ru), and tungsten (W), and alloy materials thereof in view of affinity for another semiconductor manufacturing process such as wiring step.

In addition, the boundary surface between the barrier metal BM2 and the memory gate electrode MG1 is located below the upper surface of the fin FI (on the side of the main surface of the semiconductor substrate SB).

According to this structure, the memory gate electrode MG2 does not contribute to the operation of the MONOS and only the memory gate electrode MG1 contributes to the operation of the MONOS. This makes it possible to allow the portion on which an electric field concentrates (place in the vicinity of the upper portion of the fin) to be a region not used during memory operation and deterioration in the ONO film due to rewriting can be suppressed.

It is also possible to form, in the upper portion of the fin Fin, a barrier metal made of, for example, a titanium nitride film (TiN) between the ONO film ON and the barrier metal BM2 as a protective film of the ONO film ON, and a barrier metal made of, for example, a titanium nitride film (TiN) between the barrier metal BM2 and the memory gate electrode MG2 as a base protective film or a diffusion preventive film of the metal gate electrode material of the memory gate electrode MG2. In this case, the work function (that is, threshold voltage) of the memory gate electrode MG2 can be controlled by differentiating the material or film thickness of the barrier metal BM2, the above-described two layers of the barrier metal made of a titanium nitride film (TiN), or the metal gate electrode material (memory gate electrode MG2).

The invention made by the present inventors has been described above specifically based on the embodiment. However, it is needless to say that the invention is not limited by the above-described embodiment and it can be changed in various ways without departing the gist of the invention.

What is claimed is:
1. A semiconductor device comprising:
a semiconductor substrate;
a protruding semiconductor layer which is a portion of the semiconductor substrate, protrudes from a main surface of the semiconductor substrate, and extends in a first direction along the main surface;
a gate electrode adjacent to an upper surface and a side surface of the protruding semiconductor layer via an insulating film including a charge accumulation film and extending in a second direction crossing the first direction; and a source region and a drain region sandwiching the gate electrode therebetween in the first direction of the protruding semiconductor layer, wherein the gate electrode has 1) a first gate electrode adjacent to the side surface of the protruding semiconductor layer via the insulating film and in contact with the insulating film positioned on the side surface of the protruding semiconductor layer and 2) a second gate electrode adjacent to the upper surface of the protruding semiconductor layer via the insulating film and in contact with the insulating film positioned on the upper surface of the protruding semiconductor layer, wherein the first gate electrode and the second gate electrode include respectively different electrode materials, wherein a boundary surface between the first gate electrode and the second gate electrode lies on the side of the main surface with respect to the upper surface of the protruding semiconductor layer, and wherein the electrode material of the second gate electrode has a work function higher than that of the electrode material of the first gate electrode.

2. The semiconductor device according to claim 1, wherein the electrode material of the first gate electrode is polysilicon, and wherein the electrode material of the second gate electrode is any of Al, Ti, Ta, Ru, W, and alloy materials containing any of Al, Ti, Ta, Ru, and W.

3. The semiconductor device according to claim 2, wherein the first gate electrode and the second gate electrode have therebetween a barrier metal.

4. The semiconductor device according to claim 1, wherein the electrode material of the first gate electrode is polysilicon, and wherein the electrode material of the second gate electrode is a metal silicide.

5. The semiconductor device according to claim 4, wherein the first gate electrode and the second gate electrode have therebetween a silicon oxide film.

6. The semiconductor device according to claim 1, wherein the respective electrode materials of the first gate electrode and the second gate electrode are each any of Al, Ti, Ta, Ru, W, and alloy materials containing any of Al, Ti, Ta, Ru, and W.

7. The semiconductor device according to claim 2, wherein the first gate electrode and the second gate electrode have therebetween a work function control film including TaN or TiN.

8. The semiconductor device according to claim 7, wherein the first gate electrode and the work function control film and the second gate electrode and the work function control film each have therebetween a barrier metal.

9. A semiconductor device comprising:

a semiconductor substrate;

a protruding semiconductor layer which is a portion of the semiconductor substrate, protrudes from a main surface of the semiconductor substrate, and extends in a first direction along the main surface;

a memory gate electrode adjacent to an upper surface and a side surface of the protruding semiconductor layer via a first insulating film including a charge accumulation film and extending in a second direction crossing the first direction;

a control gate electrode adjacent to the memory gate electrode via the first insulating film, adjacent to the upper surface and the side surface of the protruding semiconductor layer via a second insulating film, and extending in the second direction; and a source region and a drain region sandwiching the memory gate electrode and the control gate electrode therebetween in the first direction of the protruding semiconductor layer, wherein the memory gate electrode has 1) a first gate electrode adjacent to a side surface of the protruding semiconductor layer via the first insulating film and in contact with the insulating film positioned on the side surface of the protruding semiconductor layer and 2) a second gate electrode adjacent to the upper surface of the protruding semiconductor layer via the first insulating film and in contact with the insulating film positioned on the upper surface of the protruding semiconductor layer, wherein the first gate electrode and the second gate electrode include respectively different electrode materials, wherein a boundary surface between the first gate electrode and the second gate electrode lies on the side of the main surface with respect to the upper surface of the protruding semiconductor layer, and wherein the electrode material of the second gate electrode has a work function higher than that of the electrode material of the first gate electrode.

10. The semiconductor device according to claim 9, wherein the electrode material of the first gate electrode is polysilicon, and wherein the electrode material of the second gate electrode is any of Al, Ti, Ta, Ru, W, and alloy materials containing any of Al, Ti, Ta, Ru, and W.

11. The semiconductor device according to claim 10, wherein the first gate electrode and the second gate electrode have therebetween a barrier metal.

12. The semiconductor device according to claim 9, wherein the electrode material of the first gate electrode is polysilicon, and wherein the electrode material of the second gate electrode is a metal silicide.

13. The semiconductor device according to claim 12, wherein the first gate electrode and the second gate electrode have therebetween a silicon oxide film.

14. The semiconductor device according to claim 9, wherein the respective electrode materials of the first gate electrode and the second gate electrode are each any of Al, Ti, Ta, Ru, W, and alloy materials containing any of Al, Ti, Ta, Ru, and W.

15. The semiconductor device according to claim 10, wherein the first gate electrode and the second gate electrode have therebetween a work function control film including TaN or TiN.

16. The semiconductor device according to claim 15, wherein the first gate electrode and the work function control film and the second gate electrode and the work function control film each have therebetween a barrier metal.

17. A method of manufacturing a semiconductor device, comprising the steps of:

(a) forming a fin over a main surface of a semiconductor substrate by photolithography;

(b) stacking a silicon oxide film, a silicon nitride film, and a silicon oxide film one after another and thereby forming a stacked film over the main surface of the semiconductor substrate to cover an upper surface and a side surface of the fin;

(c) after the step (b), forming a polysilicon film over the main surface of the semiconductor substrate;

(d) after the step (c), dry etching the semiconductor substrate to etch the polysilicon film until it comes below the upper surface of the fin; and (e) after the step (d), forming a metal film over the main surface of the semiconductor substrate.

18. The method of manufacturing a semiconductor device according to claim 17, further comprising, between the step (a) and the step (b), the steps of:

(f) forming a polysilicon film over the main surface of the semiconductor substrate to cover the upper surface and the side surface of the fin; and (g) after the step (f), processing the polysilicon film by photolithography into a control gate electrode.

* * * * *